(12) United States Patent
Tauke-Pedretti et al.

(10) Patent No.: US 9,029,239 B2
(45) Date of Patent: May 12, 2015

(54) SEPARATING SEMICONDUCTOR DEVICES FROM SUBSTRATE BY ETCHING GRADED COMPOSITION RELEASE LAYER DISPOSED BETWEEN SEMICONDUCTOR DEVICES AND SUBSTRATE INCLUDING FORMING PROTUBERANCES THAT REDUCE STICTION

(71) Applicant: Sandia Corporation, Albuquerque, NM (US)

(72) Inventors: Anna Tauke-Pedretti, Albuquerque, NM (US); Gregory N. Nielson, Albuquerque, NM (US); Jeffrey G. Cederberg, Albuquerque, NM (US); Jose Luis Cruz-Campa, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/067,433

(22) Filed: Oct. 30, 2013

(65) Prior Publication Data
US 2014/0048123 A1 Feb. 20, 2014

Related U.S. Application Data

(60) Continuation-in-part of application No. 13/707,875, filed on Dec. 7, 2012, now Pat. No. 8,592,249, which is a division of application No. 12/957,082, filed on Nov. 30, 2010, now Pat. No. 8,329,503, which is a continuation-in-part of application No. 11/933,458, filed on Nov. 1, 2007.

(51) Int. Cl.
*H01L 21/46* (2006.01)
*H01L 31/0735* (2012.01)
*H01L 31/18* (2006.01)

(52) U.S. Cl.
CPC ............ *H01L 31/18* (2013.01); *H01L 31/0735* (2013.01); *H01L 31/1852* (2013.01); *H01L 31/1892* (2013.01); *Y02E 10/52* (2013.01); *Y02E 10/544* (2013.01)

(58) Field of Classification Search
USPC .................................................. 257/E21.513
See application file for complete search history.

(56) References Cited

U.S. PATENT DOCUMENTS

| | | | |
|---|---|---|---|
| 5,468,652 | A | 11/1995 | Gee |
| 5,792,280 | A | 8/1998 | Ruby et al. |
| 5,871,591 | A | 2/1999 | Ruby et al. |
| 5,944,913 | A | 8/1999 | Hou et al. |
| 5,951,786 | A | 9/1999 | Gee et al. |
| 5,972,732 | A | 10/1999 | Gee et al. |
| 6,091,021 | A | 7/2000 | Ruby et al. |
| 6,252,287 | B1 | 6/2001 | Kurtz et al. |
| 8,236,611 | B1 | 8/2012 | Anderson et al. |
| 8,461,023 | B1 | 6/2013 | Swiler et al. |
| 8,906,803 | B2 * | 12/2014 | Okandan et al. ............... 438/667 |

* cited by examiner

*Primary Examiner* — Cheung Lee
(74) *Attorney, Agent, or Firm* — Martin I. Finston

(57) ABSTRACT

A method includes etching a release layer that is coupled between a plurality of semiconductor devices and a substrate with an etch. The etching includes etching the release layer between the semiconductor devices and the substrate until the semiconductor devices are at least substantially released from the substrate. The etching also includes etching a protuberance in the release layer between each of the semiconductor devices and the substrate. The etch is stopped while the protuberances remain between each of the semiconductor devices and the substrate. The method also includes separating the semiconductor devices from the substrate. Other methods and apparatus are also disclosed.

16 Claims, 16 Drawing Sheets

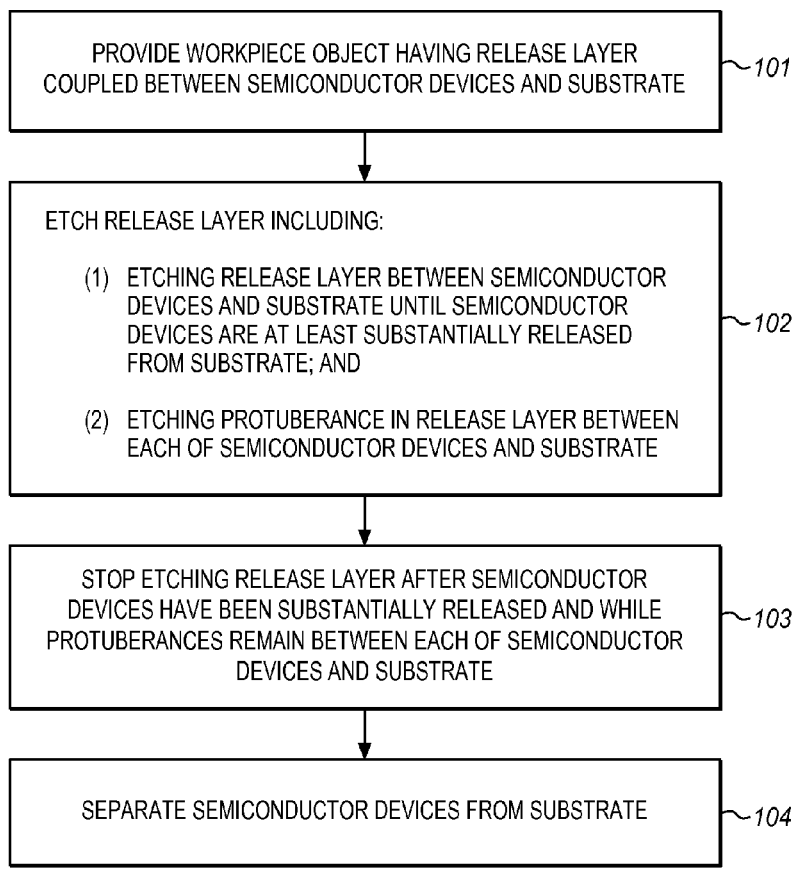

US 9,029,239 B2

SEPARATING SEMICONDUCTOR DEVICES FROM SUBSTRATE BY ETCHING GRADED COMPOSITION RELEASE LAYER DISPOSED BETWEEN SEMICONDUCTOR DEVICES AND SUBSTRATE INCLUDING FORMING PROTUBERANCES THAT REDUCE STICTION

CROSS-REFERENCE TO RELATED APPLICATIONS

This is a continuation-in-part application of pending U.S. patent application Ser. No. 13/707,875 filed Dec. 7, 2012, which is a divisional application of U.S. patent application Ser. No. 12/957,082 filed Nov. 30, 2010, issued on Dec. 11, 2012 as U.S. Pat. No. 8,329,503, which is a continuation-in-part of pending U.S. patent application Ser. No. 11/933,458 filed Nov. 1, 2007. The entireties of these applications are incorporated herein by reference.

STATEMENT OF GOVERNMENT RICHES

This invention was developed under Contract DE-AC04-94AL85000 between Sandia Corporation and the U.S. Department of Energy. The U.S. Government has certain rights in this invention.

FIELD

Embodiments described herein generally relate to semiconductor processing. In particular, embodiments described herein generally relate to methods and apparatus for separating semiconductor devices from a substrate.

BACKGROUND

Photovoltaics refers to a technology for converting solar radiation or other forms of light into electricity. The electricity generated through photovoltaics may be used for various different purposes, such as, for example, to power electrical devices or systems, provide electricity to an electrical grid, or recharge batteries or otherwise store power. Photovoltaics may offer various potential advantages depending on the implementation. For one thing, photovoltaics is generally able to provide a relatively sustainable and/or renewable supply of energy. Additionally, photovoltaics generally tends to produce low to no pollution during use. Furthermore, photovoltaics may be used to provide electricity (e.g., to an electrical device, battery, etc.) in environments where such electricity is not otherwise necessarily readily available (e.g., mobile devices, remote locations). Additionally, photovoltaics are often able to provide a lightweight power source.

Photovoltaic cells or photovoltaic devices generally represent devices that are able to convert the solar radiation or other forms of light into electricity based on the photovoltaic effect. The photovoltaic cells are sometimes referred to in the arts as solar cells. The photovoltaic cells are commonly made from various different types of semiconductor materials. Some photovoltaic cells are made from silicon based materials. Other photovoltaic cells are made from group III-V compound semiconductor based materials. Still other photovoltaic cells are made from various other types of materials. Different materials are commonly used for different reasons. For example, the silicon based materials generally offer the advantages of lower cost and/or a wider and more extensively developed set of fabrication technologies. Group III-V compound semiconductor based materials generally tend to be more costly, but often offer greater photovoltaic efficiencies.

In some applications, small and thin photovoltaic cells may offer advantages. Representatively, the small photovoltaic cells may have lateral dimensions on the order of several millimeters or less, and thicknesses on the order of several hundred micrometers or less. Such small and thin photovoltaic cells may be formed from reduced amounts of materials, which tends to decrease their manufacturing costs. Additionally, such small and thin photovoltaic cells may tend to have higher efficiencies, for example, due to reduced likelihood that they contain performance limiting features (e.g., point defects).

However, one challenge encountered when manufacturing such small and thin photovoltaic cells is that it tends to be more difficult to handle them and/or assemble them into photovoltaic modules, electronic devices, or other assemblies. Similar challenges present themselves when manufacturing other types of small and thin semiconductor devices.

SUMMARY

In one aspect, a method may include etching a release layer that is coupled between a plurality of semiconductor devices and a substrate with an etch. The etching may include etching the release layer between the semiconductor devices and the substrate until the semiconductor devices are at least substantially released from the substrate. In some embodiments, the release layer may optionally be a graded composition release layer. The etching may also include etching a protuberance in the release layer between each of the semiconductor devices and the substrate. The etch may be stopped while the protuberances remain between each of the semiconductor devices and the substrate. The method may also include separating the semiconductor devices from the substrate.

An apparatus of an aspect includes a substrate, a plurality of semiconductor devices over the substrate. The semiconductor devices may be substantially released from the substrate. The apparatus also includes a protuberance between each of the semiconductor devices and the substrate. In some embodiments, the protuberances may optionally have a graded composition.

A method of another aspect includes coupling a first receiving substrate with a first subset of semiconductor devices. Each of the semiconductor devices of the first subset may be disposed over a substrate with a corresponding, protuberance disposed between the semiconductor device of the first subset and the substrate. The first receiving substrate and the first subset of the semiconductor devices may be separated from the substrate. A second receiving substrate may be coupled with a second subset of the semiconductor devices. Each of the semiconductor devices of the second subset may be disposed over the substrate with a corresponding protuberance disposed between the semiconductor device of the second subset and the substrate. The second receiving substrate and the second subset of the semiconductor devices may be separated from the substrate.

The above summary does not include an exhaustive list of all aspects of embodiments of the invention. It is contemplated that embodiments may include all systems and methods that may be practiced from all suitable combinations of the various aspects summarized above, as well as those disclosed elsewhere herein in the Detailed Description, and particularly pointed out in the claims filed with the application.

BRIEF DESCRIPTION OF THE DRAWINGS

The invention may best be understood by referring to the following description and accompanying drawings that are used to illustrate embodiments of the invention. In the drawings:

FIG. 1 is a block flow diagram of an embodiment of a method of separating semiconductor devices from a substrate by etching a release layer.

DETAILED DESCRIPTION

In the following description, numerous specific details are set forth (e.g., specific types of semiconductor devices, device structures, materials, orders of operations, and the like). However, it is understood that embodiments of the invention may be practiced without these specific details. In other instances, well-known circuits, structures and techniques have not been shown in detail in order not to obscure the understanding of this description.

Figure 2A:
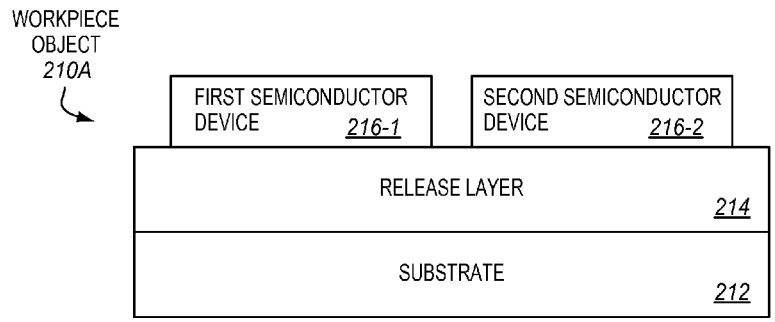
FIGS. 2A-2C are cross-sectional side views of embodiments of workpiece objects at different stages of an embodiment of an approach for separating semiconductor devices from a substrate by etching a release layer.
Figure 2B:
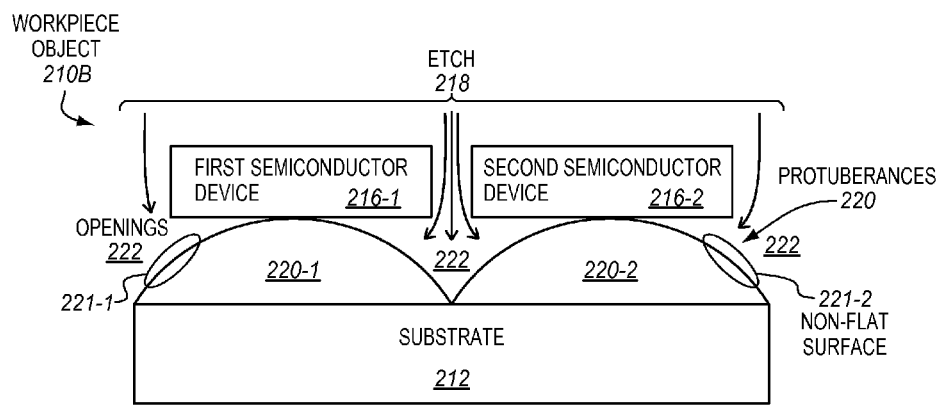
Figure 2C:
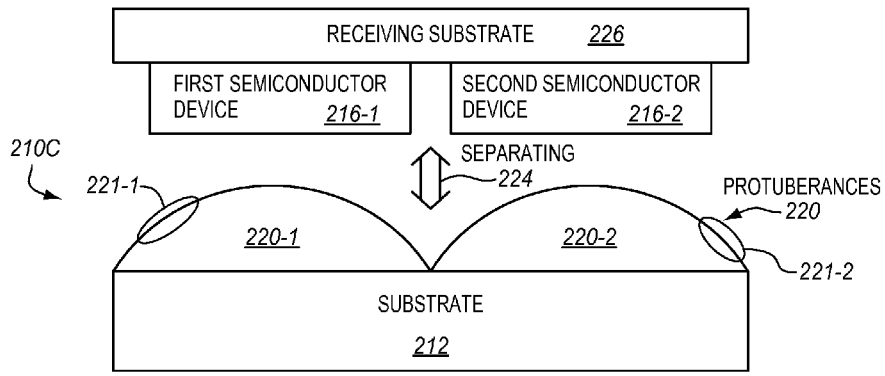

FIG. 1 is a block flow diagram of an embodiment of a method 100 of separating semiconductor devices from a substrate by etching a release layer. FIGS. 2A-2C are cross-sectional side views of embodiments of workpiece objects (e.g., in-process wafers or other intermediate substrates) at different stages of an embodiment of a method of separating semiconductor devices from a substrate by etching a release layer. To facilitate the description, the method of FIG. 1 will be described in conjunction with the views of FIGS. 2A-2C. The components, features, and optional details described for the workpiece objects of FIGS. 2A-2C also optionally apply to the operations and/or method of FIG. 1, which in embodiments may be performed using such workpiece objects. However, it is to be appreciated that the operations and/or method of FIG. 1 may be used with different substrates than those of FIGS. 2A-2C. Moreover, the workpiece objects of FIGS. 2A-2C may be used with different operations and/or methods than those of FIG. 1.

Referring initially to FIG. 1, the method includes providing a workpiece object, at block 101. The workpiece object may represent an in-process wafer, other intermediate substrate, or other workpiece object used to form semiconductor devices during a manufacturing process. As used herein, "providing" the workpiece object is to be interpreted broadly as fabricating, purchasing, trading for, or otherwise obtaining the workpiece object. In some embodiments, the workpiece object may have a release layer that is coupled between multiple semiconductor devices and a substrate. In some embodiments, the release layer may be a graded composition release layer in which a concentration or other composition of at least one component is graded across a thickness of the graded composition release layer. Alternatively, a non-graded composition or homogeneous composition release layer may optionally be used.

Turning now to FIG. 2A, an embodiment of workpiece object 210A includes a substrate 212, a release layer 214, and semiconductor devices 216-1, 216-2 (collectively semiconductor devices 216). The substrate is to be interpreted broadly herein. In one example, the substrate may be a semiconductor substrate that includes a wafer or other piece of semiconductor material optionally having one or more semiconductor layers formed thereon. In another example, the substrate may include a support substrate (e.g., a silicon substrate, a ceramic substrate, a glass substrate, etc.) having one or more semiconductor layers formed thereon. It is to be appreciated that in some implementations the semiconductor substrate may also optionally include other materials besides just semiconductors, such as, for example, dielectric materials, metals, and other materials commonly found in the substrates on which semiconductor devices are formed.

The semiconductor devices 216 have been formed over the substrate 212. For simplicity, the illustration only shows a first semiconductor device 216-1 and a second semiconductor device 216-2, although it is to be appreciated that there may be any desired number of such semiconductor devices. For example, there may be a two-dimensional of such devices, for example, including on the order of from tens to many thousands of such devices. For example, in one particular embodiment, the substrate may measure several inches in cross-section, each of the semiconductor devices may measure several millimeters or less (or in some cases 1 mm or less) in cross-section, and the semiconductor devices may be arranged in a two dimensional array fit substantially as many as possible over the substrate. In the case of photovoltaic cells, the ability to produce such small cells may offer various possible advantages, such as, for example, generally favorable photovoltaic efficiencies, various scaling effects due the size, an ability to make flexible solar panels, etc. However, it is to be appreciated that the scope of the invention is not so limited to any known number of such semiconductor devices.

In some embodiments, the semiconductor devices 216 may include photovoltaic cells or other photovoltaic devices. Each photovoltaic cell or device may include either a single photovoltaic "pixel" or multiple photovoltaic "pixels". In some cases, each photovoltaic cell or device may include a two-dimensional array having on the order of tens, to on the order of hundreds, of such photovoltaic pixels, although the scope of the invention is not so limited. In some embodiments, the photovoltaic cells or devices may represent group III-V compound semiconductor photovoltaic cells or devices, although the scope of the invention is not so limited. In other embodiments, other semiconductor devices besides photovoltaic devices may be used. Examples of other suitable types of semiconductor devices include, but are not limited to, photodiode arrays, semiconductor laser devices (e.g., vertical-cavity surface-emitting lasers (VCELs)), other group III-V compound semiconductor devices, other types of integrated circuits (e.g., microcontrollers, microelectromechanical systems (MEMS)), or the like.

The present disclosure refers to group III-V compound semiconductor devices. The term compound semiconductor generally refers to a semiconductor compound composed of elements from two or more different groups of the periodic table. The term group III-V compound semiconductor refers to an old/legacy naming convention which is still used today in the arts. It is to be appreciated that the group III-V compound semiconductors may alternatively be referred to as group 13-15 compound semiconductors using the present day nomenclature. Group 13 includes the elements boron (B), aluminum (Al), gallium (Ga), indium (In), and thallium (Tl), and is sometimes referred to as the boron group. Group 15 includes the elements nitrogen (N), phosphorus (P), arsenic (As), antimony (Sb), and bismuth (Bi), and is sometimes referred to as the nitrogen group or the pnictogens.

The release layer 214 is coupled between the semiconductor devices 216 and the substrate 212. In the illustration, the semiconductor devices are formed over the release layer, and the release layer is formed over the substrate. The terms "coupled" and "connected," along with their derivatives, may be used herein. These terms are not intended as synonyms for each other. Rather, in particular embodiments, "connected" may be used to indicate that two or more elements are in direct physical and/or electrical contact with each other. "Coupled" may mean that two or more elements are in direct physical or electrical contact with each other. However, "coupled" may also mean that two or more elements are not in direct contact with each other. For example, the release layer may be coupled with substrate and/or the semiconductor devices through one or more intervening elements (e.g., layers, materials, structures, etc.). Similarly, a first element "over" a second element may refer to either the first element directly "on" the second element, or there may be one or more intervening elements disposed between the first and second elements. Furthermore, it should be noted that terms such as "over," "under," "top," "bottom," "vertical," "horizontal," and the like, are used herein to refer to the structures as viewed in the illustrations, although the structures may be used in a variety of different orientations.

In some embodiments, as the name implies, the release layer may be etched to help release the semiconductor devices from the substrate. In some embodiments, the release layer may have a thickness ranging from about 200 Å to about 10 µm, or in some cases from about 500 Å to about 5 µm, although the scope of the invention is not so limited. In some embodiments, the release layer may be a graded composition release layer in which a concentration or other composition of at least one component may be graded across a thickness of the layer. The gradation in the composition of the at least one component may change gradually and continuously (e.g., linearly, nonlinearly, etc.), by a series of two or three or more discrete or stepwise levels, or a combination thereof. By way of example, in one embodiment suitable for group III-V compound semiconductor devices, the graded composition release layer may include a graded indium-gallium-arsenide to indium-gallium-arsenide-phosphorous layer in which a relative composition of phosphorous to arsenic changes across a thickness of the layer, although the scope of the invention is not so limited. In some embodiments, the graded composition may modify an etch rate of a given etch.

Referring again to FIG. 1, the method includes etching the release layer with an etch, at block 102. In some embodiments, the release layer may be a graded composition release layer and the etch may have an etch rate that depends on the composition of the at least one component that is graded across the thickness of the graded composition release layer, although the scope of the invention is not so limited. The change in the composition of the at least one component across the layer may change the etch rate. As a result, the etch rate may vary with depth across the thickness of the graded composition release layer. In some embodiments, the etching may include etching the release layer between the semiconductor devices and the substrate until the semiconductor devices are at least substantially released from the substrate. The etch may etch under the semiconductor devices (e.g., undercut the semiconductor devices). As used herein, the term "substantially released" encompasses either released and/or released enough that the semiconductor devices can be separated from the substrate using a given approach to couple a receiving substrate, as discussed further below.

In some embodiments, the etching at block 102 may include shaping, forming, carving, or otherwise etching a protuberance in the release layer (e.g., shaping the protuberance out of the release layer) between each of the semiconductor devices and the substrate. As used herein, the term "protuberance" refers broadly to a structure that bulges, protrudes, extends, or otherwise protrudes from a surface. Examples of suitable protuberances include, but are not limited to, structures, materials, surfaces, or other elements in the form of bulges (e.g., elements that bulge out from a surface), protrusions (e.g., elements that protrude from a surface), convexities (e.g., elements that are curved or rounded outwardly), humps, mounds, hills, hemispherical elements, conical shapes, truncated conical shapes, raised mesas, and the like, and combinations thereof. The protuberances provide a non-flat (i.e., non-coplanar, curved, rounded, etc.) surface between each of the semiconductor devices and the substrate. Accordingly, the etching may involve forming a non-flat (i.e., non-coplanar, curved, rounded, etc.) surface between each of the semiconductor devices and the substrate. The duration of the each and the positions and sizes of the etch access openings may be used to control the shape of the protuberance. In addition, in embodiments that use a graded composition release layer, the variation in the etch rate with the variation in the graded composition may also be used to control the size and shape of the protuberances. In such cases, the protuberances formed from the the graded composition release layer may represent graded composition protuberances that have a graded composition across their thickness.

After the etching at block 102, the method includes stopping the etch at block 103. In some embodiments, the etch is stopped after the semiconductor devices have been at least substantially released, and while the protuberances and/or the non-flat surfaces remain between each of the semiconductor devices and the substrate. If the etch were allowed to continue further, the protuberances would be etched further and decrease in size and may generally would disappear entirely if the etch were allowed to proceed long enough.

FIG. 2B illustrates an embodiment of a workpiece object 210B at a suitable time to stop an etch 218 of the release layer 214 of FIG. 2A. As shown, the etch may be stopped after the semiconductor devices 216 have been at least substantially released, and while protuberances 220-1, 220-2 (collectively protuberances 220) and/or non-flat surfaces 221-1, 221-2 (collectively non-flat surfaces 221) remain between each of the respective semiconductor devices 216 and the substrate 212. The protuberances 220 and/or non-flat surfaces 221 have been etched from the release layer 214 (e.g., carved out of the release layer). In particular, a first protuberance 220-1 and/or non-flat surface 221-1 have been etched between the first semiconductor device 216-1 and the substrate 212, and a second protuberance 220-2 and/or non-flat surface 221-2 have been etched between the second semiconductor device 216-2 and the substrate 212. Openings 222 have been defined between the protuberances and the semiconductor devices where portions of the release layer 214 have been etched away or removed while carving out the protuberances.

In the illustrated embodiment, the semiconductor devices 216 are still optionally partially coupled with the respective protuberances 220, although this is not required. However, the semiconductor devices are coupled with the protuberances along smaller areas of contact and/or by weaker couplings than prior to the etch. For example, as shown in the illustrated embodiment, the protuberances may be shaped approximately like hemispherical protuberances with only the tops or apexes of the hemispherical protuberances coupled with the bottoms of the semiconductor devices, although the scope of the invention is not so limited. Such couplings on such small areas of contact and/or such weak couplings can be readily broken or severed, as will be described further below. In other embodiments, the etching may be allowed to continue further until the semiconductor devices have been fully released from the substrate (e.g., until there is a gap between the tops of the protuberances and the bottoms of the semiconductor devices). Having the devices fully released may make it easier to separate them front the substrate. As will be described further below, anchors may optionally be thrilled or applied to anchor or support the semiconductor devices. It is to be appreciated that the scope of the invention is not limited to the particular hemispherical protuberances. Rather, any of the other shaped protuberances mentioned elsewhere herein, any others appreciated by those skilled in the art and having the benefit of the present disclosure, may be used instead.

One significant advantage to forming the protuberances 220 and/or the non-flat surfaces 221 between the semiconductor devices 216 and the substrate 212 is that it may help to prevent or at least reduce generally undesired attractive forces between the semiconductor devices and the substrate. The protuberances and/or non-flat surfaces may help to reduce contact areas between the semiconductor devices and other nearby surfaces. Without the protuberances or non-flat surfaces, the bottom surfaces of the semiconductor devices could potentially lie flat against the top coplanar surface of the substrate. For example, this may tend to occur in the case of a silicon dioxide layer which may also be used as a release layer (without a graded composition) for certain types of silicon based semiconductor devices when the etch is not stopped while protuberances remain. Such relatively larger surface areas in contact would generally tend to experience relatively stronger attractive forces due to stiction, static cohesion, sticking, Van der Waals type forces, hydrogen bonding forces, electrostatic forces, or the like. Such attractive forces generally tend to increase with increasing contact area. Moreover, such attractive forces may be generally undesirable because they may tend to make it more difficult to separate the semiconductor devices from the substrate. Moreover, if some semiconductor devices are stuck but others are not, this may tend to make the forces needed to separate the semiconductor devices from the substrate variable. However, the protuberances and/or the non-flat surfaces may help to reduce or limit the contact areas between the semiconductor devices and the substrate and thereby limit such attractive forces. As shown, the semiconductor devices may contact the protuberances (if they contact the protuberances at all) at relatively small contact areas (e.g., at the apexes of the protuberances). Even if the semiconductor devices slide, fall, or the like, they still may contact relatively small and often rounded or curved surfaces the protuberances (e.g., as opposed to a larger flat surface), which generally helps to reduce the amount of stiction or other attractive forces.

Referring again to FIG. 1, the method includes separating the semiconductor devices from the substrate, at block 104. In some embodiments, this may include increasing a distance of separation between the semiconductor devices and the substrate. In some embodiments, this may include coupling at least one receiving substrate with at least a subset of the semiconductor devices while they are coupled with the substrate, and then separating the at least one receiving substrate and at least the subset of the semiconductor devices from the substrate. Either or both of the receiving substrate and the substrate may be moved relative to one another.

FIG. 2C illustrates an embodiment of separating 224 the semiconductor devices 216 from the substrate 212. A receiving substrate 226 is coupled with top surfaces of the semiconductor devices 216. By way of example, the receiving, substrate may be coupled with the top surfaces of the semiconductor devices of the workpiece object 210B of FIG. 2B. In some embodiments, the receiving substrate may be physically and/or electrically coupled with the semiconductor devices. For example, in some embodiments, reflowed solder bumps may be used to electrically and physically couple the receiving substrate with the semiconductor devices. As another option, in some embodiments, an adhesive material may be used to physically couple the receiving substrate with the semiconductor devices. For example, the receiving substrate may have an adhesive applied to a surface intended to contact the semiconductor devices. A combination of reflowed solder bumps (or other electrical couplings) and an adhesive material may also optionally be used.

Then, the receiving substrate 226 and the substrate 212 may be separated from one another. In various aspects, the receiving substrate may be moved relative to the substrate, the substrate may be moved relative to the receiving substrate, or both the receiving substrate and the substrate may be moved relative to one another. As mentioned above, in some embodiments, the coupling of the receiving substrate with the semiconductor devices may be physically stronger than the coupling of the substantially released semiconductor devices with the substrate. As a result, the semiconductor devices may remain bonded or coupled with the receiving substrate, and may fully release and separate from the substrate. In some embodiments, the separation may involve separating the semiconductor devices and the protuberances 220 and/or non-flat surfaces 221. In some embodiments, the separation may involve lifting the semiconductor substrates off tops of the protuberances. In some embodiments, relatively weak couplings of the semiconductor substrates to the protuberances may be broken or severed. Notice that in the illustration, the protuberances remain behind still coupled with the substrate. In other embodiments this may not be the case, as will be discussed further below (e.g., the protuberances may remain connected to the semiconductor devices).

In some embodiments, the separation of the receiving substrate 226 from the substrate 212 may involve a wafer-level lift off of multiple or potentially many semiconductor devices 216 across the length of the substrate 212. In some embodiments, all of the semiconductor devices 216 may be lifted off in one such lift-off operation with one receiving substrate. Alternatively, different groups or subsets of the semiconductor devices 216 may be lifted off during different lift-off operations with different receiving substrates. For example, two, three, or four, or more of such lift-off operations may be used to separate substantially all of the semiconductor devices from off the substrate. In some embodiments, rigid receiving substrate(s) may be used. In other embodiments, flexible receiving substrate(s) may be used. In some embodiments, flexible receiving substrate(s) that are substantially puncture proof may optionally be used, although this is not required.

It is to be appreciated that the scope of the invention is not limited to the particular method and substrates/objects described above. The method of FIG. 1 and the approach of FIGS. 2A-2C have been shown and described in a relatively basic form, but additional operations may optionally be added and/or certain operations may be removed. For example, in an alternate embodiment, the method of FIG. 1 may optionally omit the operation of block 101 and/or 104. For example, the operation of block 104 may be performed by another entity, at another facility, etc. In other embodiments, various other operations disclosed elsewhere herein may optionally be added to the operations of Figure and/or FIGS. 2A-2C (e.g., anchors may be formed, substrates may be regenerated, etch openings may be formed, etch stop layers may be deposited, etc.).

FIGS. 3A-3I are cross-sectional side views of embodiments of workpiece objects at different stages of an embodiment of an approach for separating group III-V compound semiconductor devices from a substrate by etching a graded composition group III-V compound semiconductor release layer 314. In some embodiments, the workpiece objects may be used in the method of FIG. 1. The components, features, and optional details described for any of the workpiece objects of FIGS. 3A-3I also optionally apply to the operations and/or method of FIG. 1. However, it is to be appreciated that the operations and/or method of FIG. 1 may be used with different workpiece objects than those of FIGS. 3A-3I. Moreover, the workpiece objects of FIGS. 3A-3I may be used with different operations and/or a different method than that of FIG. 1.

Figure 3A:
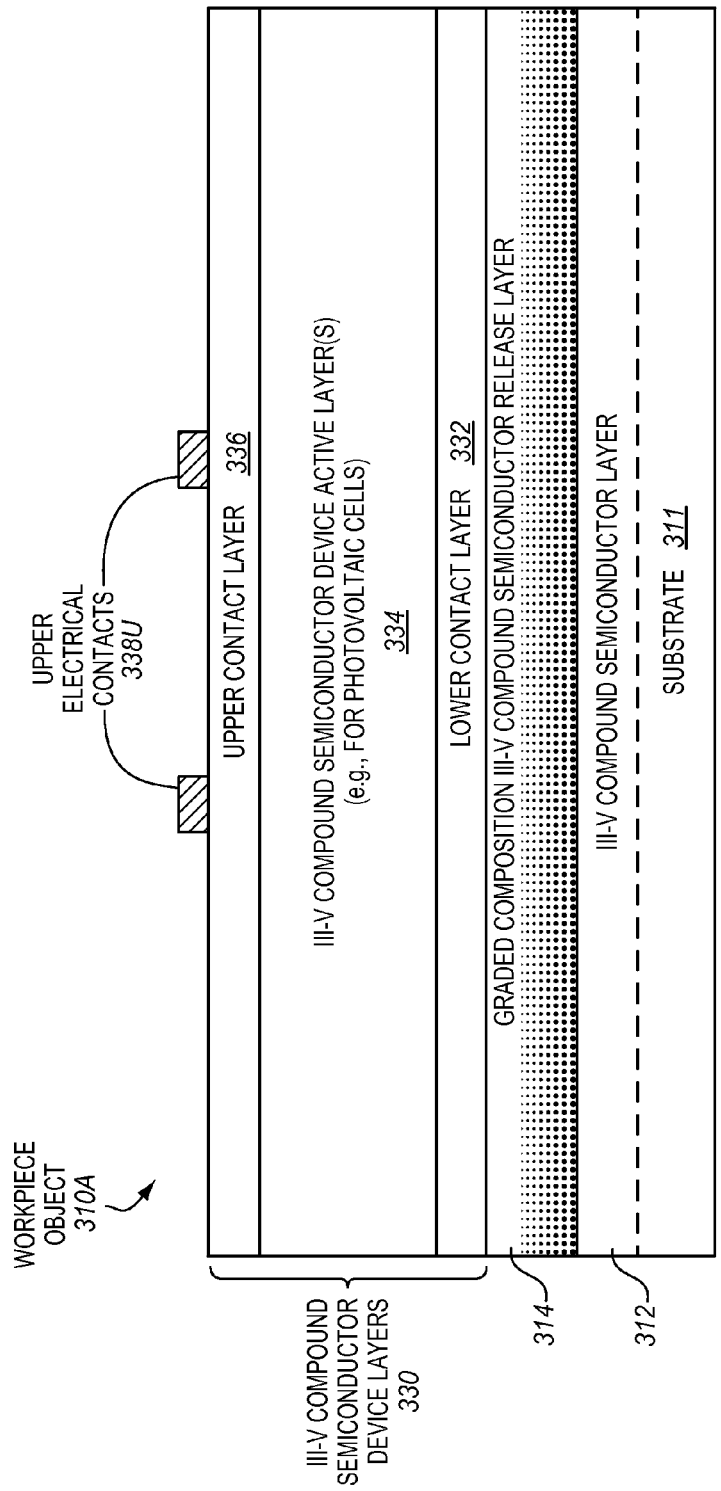
FIGS. 3A-3I are cross-sectional side views of embodiments of workpiece objects at different stages of an embodiment of an approach for separating group III-V compound semiconductor devices from a substrate by etching a graded composition group III-V compound semiconductor release layer.

FIG. 3A shows an embodiment eta workpiece object 310A having a substrate 311, and a group III-V compound semiconductor layer 312. For simplicity, the group III-V compound semiconductor layer may also be referred to herein simply as the group III-V layer. A dashed line between the substrate and the group III-V layer is used to indicate that, in some embodiments, the substrate may be a group III-V compound semiconductor substrate of which the group III-V layer is an uppermost portion. This often tends to provide high quality device layers due to the lattice match of the group III-V layer with the substrate. Such a group III-V compound semiconductor substrate often tends to be relatively costly due in part to the hulk group III-V compound semiconductor material needed to provide mechanical support, although the substrates may optionally be reused to help reduce costs, as will be disclosed further below. As another option, in some embodiments, the group III-V layer may be formed as a discrete layer on or over the substrate which is not a group III-V compound semiconductor substrate, but rather some other type of material. For example, the substrate may be a silicon substrate, a ceramic substrate, a glass substrate, a perforated substrate, or various other types of substrates less costly per unit material than group III-V compound semiconductor materials. The group III-V layer may either be formed directly on the substrate provided there is sufficient lattice matching, or one or more intervening lattice matching layers or buffer layers may be formed over the substrate between the substrate and the group III-V layer. Using such substrates may tend to be more cost effective, since relatively costly group III-V compound semiconductor materials do not need to be used to provide mechanical support that can instead be provided by more cost effective materials.

A graded composition group III-V compound semiconductor release layer 314 is formed on and/or over the group III-V layer 312. For simplicity, the graded composition group III-V compound semiconductor release layer may also be referred to herein as the graded composition release layer, the group III-V release layer, or simply the release layer. In some embodiments, the graded composition release layer may be lattice matched to the underlying group III-V layer and/or another layer on which it is formed, if this is needed for the particular implementation. As before, a composition of at least one component may be graded across a thickness of the graded composition release layer. Linear or non-linear gradual/continuous gradations, discrete or stepwise gradations, or a combination thereof, may optionally be used. In some embodiments, the graded composition release layer may have a thickness ranging from about 200 Å to about 10 μm, or in some cases from about 500 Å to about 5 μm, although the scope of the invention is not so limited. In one example embodiment, the graded composition release layer may be a graded indium-gallium-arsenide-phosphorous (InGaAsP) to indium-gallium-arsenide (InGaAs) layer. In some embodiments, the graded composition may modify an etch rate of a given etch. The gradation in the composition may change an etch rate of an etch used to etch the graded composition release layer, as will be explained further below. Any gradation operable to form the protuberances and/or non-flat surfaces discussed elsewhere herein during the etch should generally be suitable.

A set of group III-V compound semiconductor device layers 330 are formed over and/or on the graded composition release layer 314. For simplicity, the group III-V compound semiconductor device layers may also be referred to herein simply as the group III-V device layers. The group III-V device layers include a lower contact layer 332, a set of one or more group III-V compound semiconductor device active layers 336 (for simplicity also referred to herein simply as the group III-V device active layers) formed over and/or on the lower contact layer, and an upper contact layer 336 formed over and/or on the set of group III-V compound semiconductor device active layers. In some embodiments, the upper and lower contact layers may represent semiconductor layers that are latticed matched to their interfacing layers, if such lattice matching is needed for the particular implementation. Upper electrical contacts 338U are formed over and/or on the upper contact layer 336. The contacts may be formed of metal or other conductive materials. Examples of suitable metals include, but arc not limited to, gold, platinum, copper, aluminum, titanium, tantalum, other metals known in the arts to be useful for electrical contacts, and various combinations thereof. As used herein, the term metal includes alloys, stacks, and other combinations of multiple metals.

The number of group III-V device layers depends upon the particular type of semiconductor devices to be formed. In some embodiments, the group III-V device layers 334 may represent any set of layers suitable for group III-V based photovoltaic cells or other photovoltaic devices. In other embodiments, the group III-V device layers 334 may represent any set of layers suitable for other types of group III-V based devices, such as, for example, photodiode arrays, semiconductor laser devices (e.g., VCELs), MEMS, or the like. These group III-V device layers may be conventional. Accordingly, for simplicity in the illustrations, and to avoid obscuring the drawings and description with unnecessary detail pertaining to optionally conventional features, the internal structure of the group III-V device active layers have not been shown in detail.

Figure 3B:
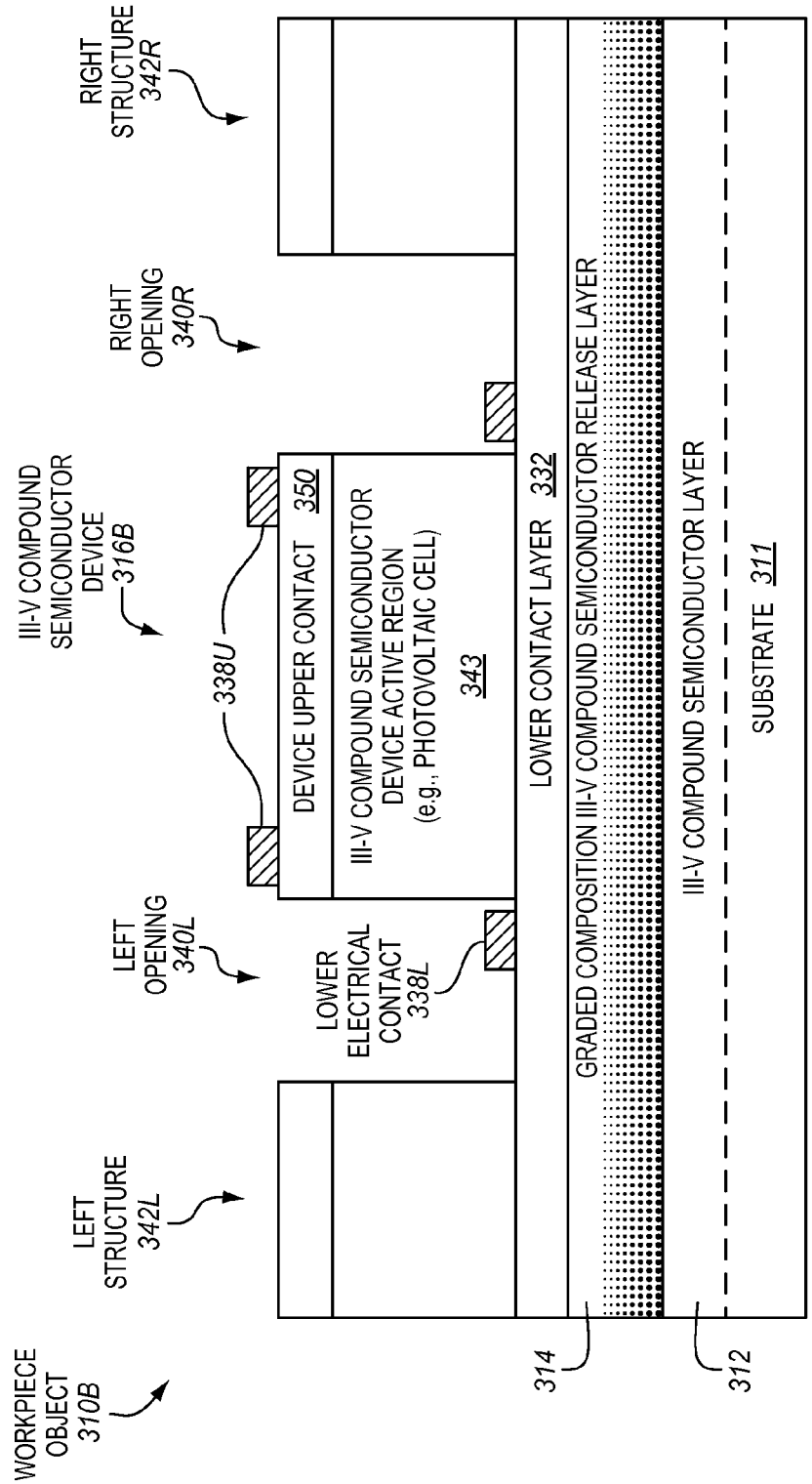

FIG. 3B shows an embodiment of a workpiece object 310B formed by etching a left opening 340L and a right opening 340R in the workpiece object of 310A of FIG. 3A. In some embodiments, the left and right openings may be formed lithographically. For example, a photoresist layer may be spin coated over the top surface of the upper contact layer 336, the photoresist layer may be photo-lithographically patterned and developed to form etch entrance openings in the photoresist layer with positions and dimensions generally corresponding to the positions and dimensions of the left and right openings, an etch may be performed to etch the left and right openings, and then the photoresist layer may be stripped or otherwise removed. Examples of suitable etches include wet and dry etches known in the arts suitable for etching the particular group III-V compound semiconductor materials involved. The left and right etch openings initially define the lateral dimensions of a group III-V compound semiconductor device 316B, which for simplicity may also be referred to as the group III-V device. In the illustrated embodiment, the left and right openings extend to the top surface of the lower contact layer 332. The group III-V device is effectively separated or carved away from an adjacent left structure 342L and an adjacent right structure 342R. The upper electrical contacts 338U remain on the top of a device upper contact 350 of the group III-V device. The group III-V device has group III-V compound semiconductor device active region 343. Lower electrical contacts 338L are also formed on the exposed top surface of the lower contact layer. The lower electrical contacts may include metal or other conductive materials of the types previously mentioned for the upper electrical contacts. The group III-V device may represent a two or more terminal group III-V device.

For simplicity, the illustration only shows a single group III-V device 316B, although it is to be appreciated that there may be any desired number of such devices across the substrate. For example, there may be a two-dimensional array of such devices including, for example, on the order of tens to many thousands of such devices. For example, in one particular embodiment, the substrate may measure several inches in cross-section, each of the group III-V devices may measure several millimeters or less in cross section (or in some cases 1 mm or less in cross-section), and the group III-V device may be arranged in a relatively closely packed two dimensional array. However, the scope of the invention is not limited to any number of such semiconductor devices. In some embodiments, each group III-V device may be relatively thin. For example, depending upon the particular types of group III-V devices, each group III-V device may have a thickness on the order of 50 µm or less, such as, for example, from about 3 µm to about 50 µm, or from about 3 µm to about 30 µm, or from about 3 µm to about 10 µm, although the scope of the invention isn't limited to any known thickness.

Figure 3C:
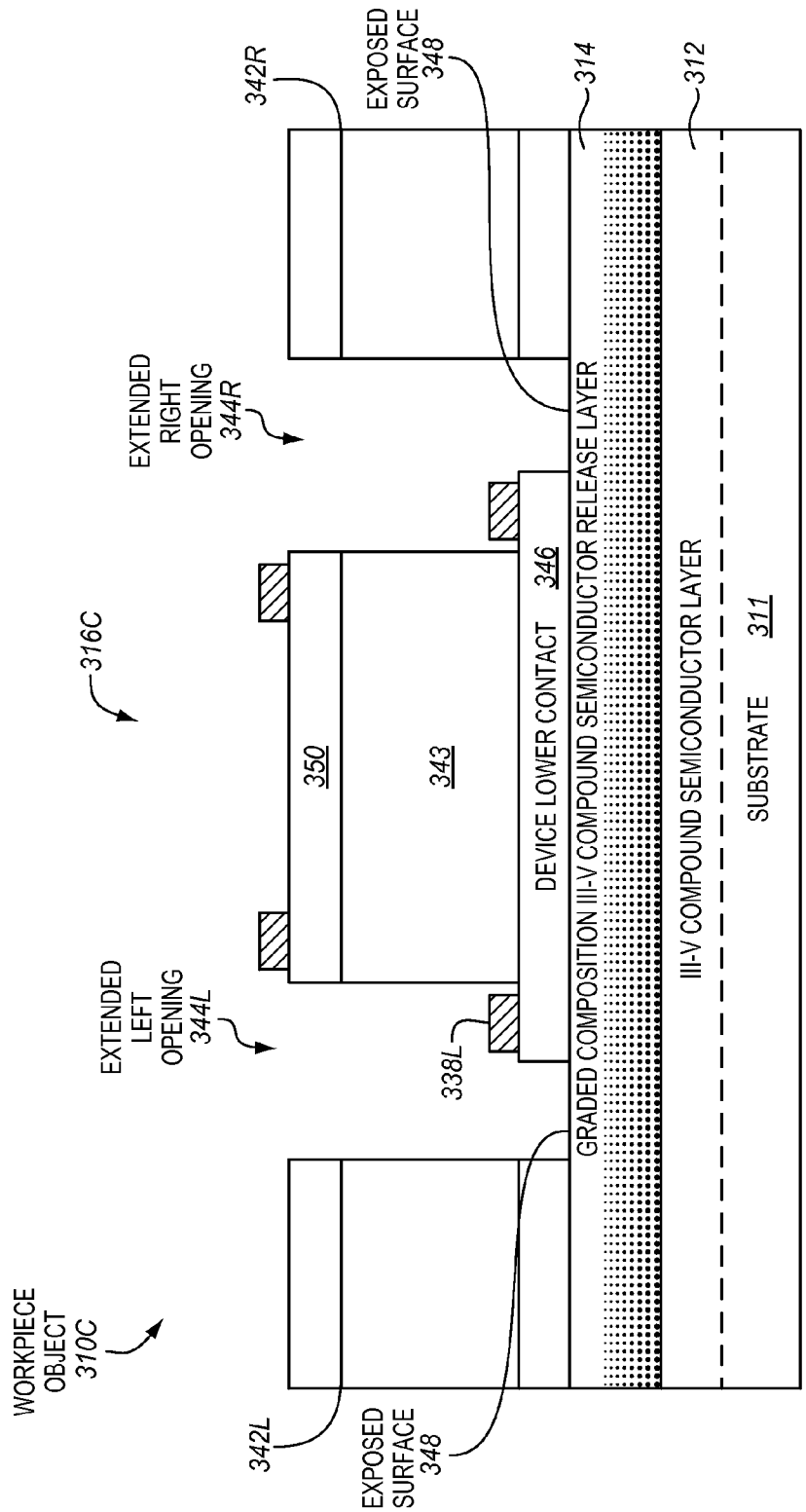

FIG. 3C shows an embodiment of a workpiece object 310C having an extended left opening 344L and an extended right opening 344R formed by extending the left opening 340L and the right opening 340R, respectively, of the workpiece object 310B of FIG. 3B. As shown, in some embodiments, the openings may be extended through the thickness of the lower contact layer 332 to form a device lower contact 346 for the group III-V device 316C. In some embodiments, the openings may be extended lithographically. For example, a photoresist layer may be spin coated over the workpiece object 310B, the photoresist layer may be photo-lithographically patterned and developed to form etch entrance openings with positions and dimensions generally corresponding to the positions and dimensions of the opening extensions, an etch may be performed to etch the openings extensions, and then the photoresist layer may be stripped or otherwise removed. The etch may expose the top surface 348 of the graded composition release layer 314 at the bottoms of the extended left and right openings.

Figure 3D:
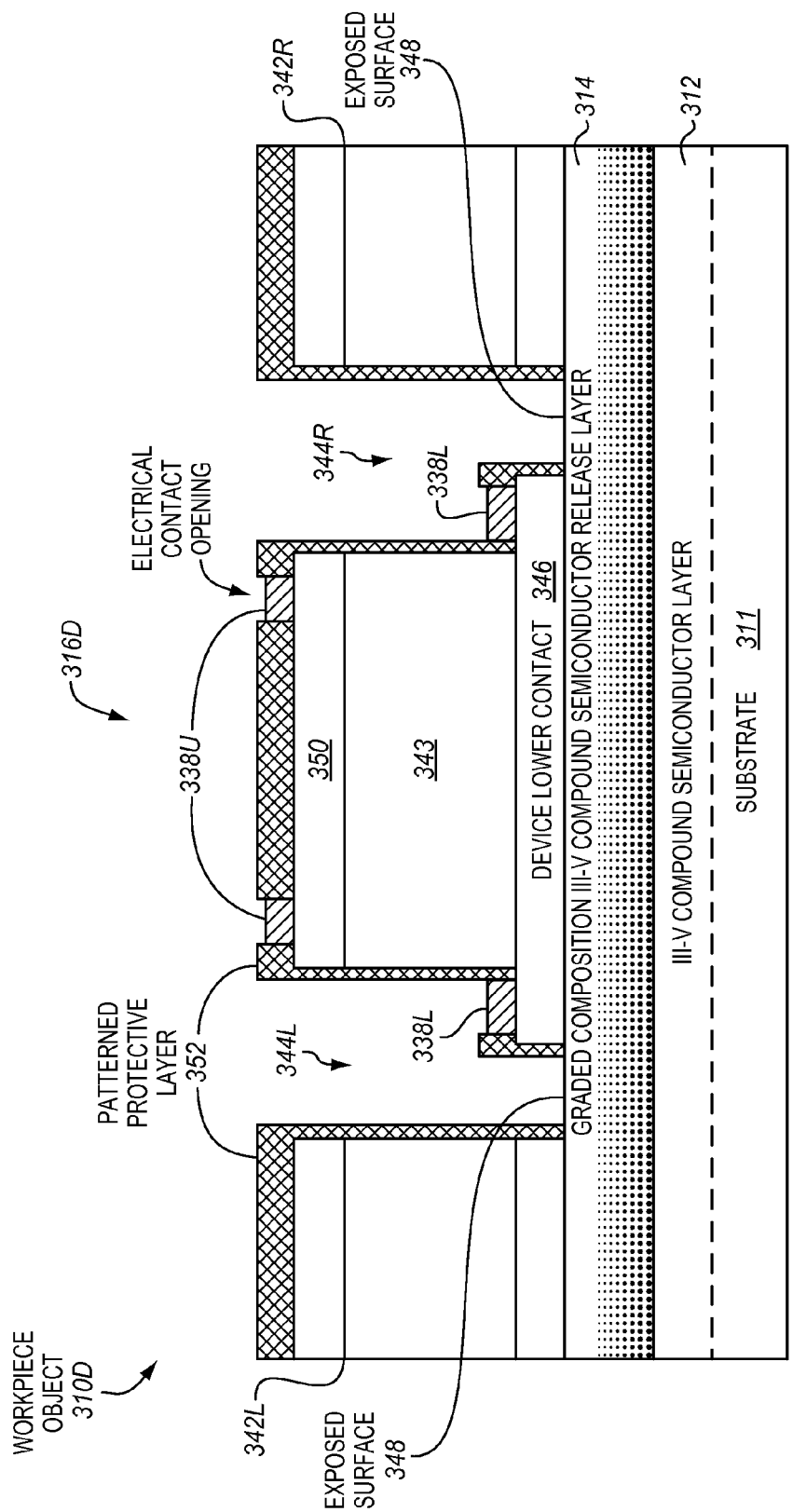

FIG. 3D shows an embodiment of a workpiece object 310D having a patterned protective layer 352 formed over the top surface of the workpiece object of 310C of FIG. 3C. In some embodiments, the patterned protective layer may represent an etch stop layer for a subsequent etch that is to be performed to etch the graded composition release layer 314 (see e.g., the discussion of FIG. 3G). By way of example, in an embodiment where the graded composition release layer is a graded indium-gallium-arsenide-phosphorous (InGaAsP) to indium-gallium-arsenide (InGaAs) layer, one suitable protective layer is a nitride of silicon (e.g., silicon nitride (SiN)), another suitable protective layer is a benzocyclobutene (BCB) layer or other similar organic layer, and yet another suitable protective layer is a polysilicon layer. Other materials not etched by the etch used for the release layer are also suitable.

As shown, in some embodiments, portions of the patterned protective layer may be removed from over the graded composition release layer 314 at the bottoms of the extended left and right openings 344L, 344R. Removing these portions of the patterned protective layer may effectively create etch entrance openings to allow the etch to access and etch the graded composition release layer. In other embodiments, a portion of the patterned protective layer may be allowed to remain as a bridge (see e.g., bridge 356 in FIGS. 3E and 3G) over the graded composition release layer to help anchor or support the substantially released group III-V device after the etch. In the illustrated embodiment, portions of the patterned protective layer have also optionally been removed from over the upper and lower electrical contacts. Alternatively, the portions of the patterned protective layer may be removed from over the upper and lower electrical contacts at a later stage, if desired. In some embodiments, the protective layer may be patterned lithographically. For example, a resist may be spin coated or otherwise deposited, exposed and developed the resist, used as an etch mask for an etch, and then stripped or otherwise removed.

Figure 3E:
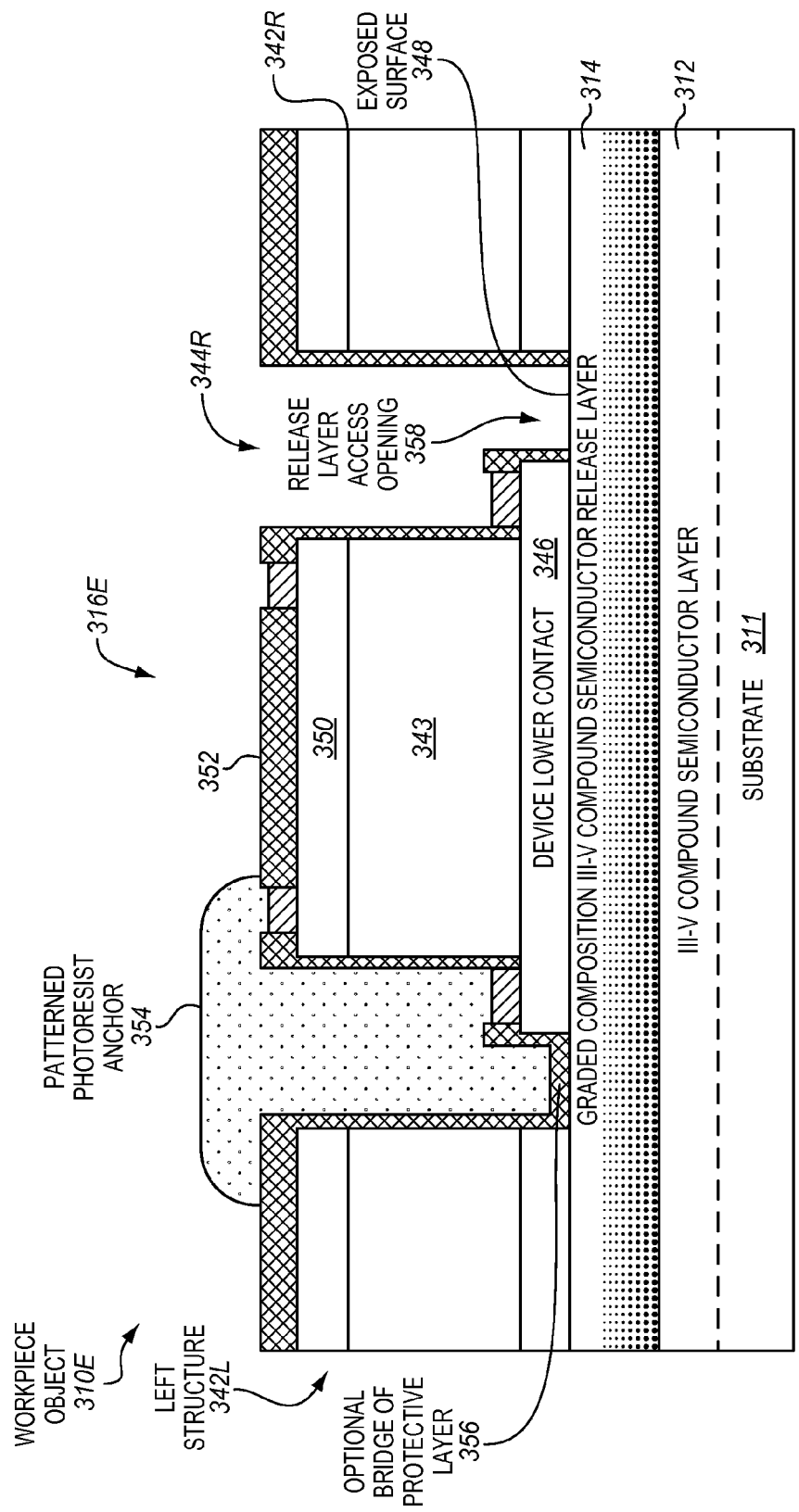

FIG. 3E shows an embodiment of a workpiece object 310E having an embodiment of an anchor 354 coupled between the group III-V device 316E and a left structure 342L. The left structure represents an example of an adjacent or nearby fixed structure. The anchor may help to anchor the group III-V device to the left structure. The anchor may represent a structure or material that is operable, after the etch of the graded composition release layer (which will be discussed further below), to anchor or hold the group III-V device in a fixed position, restrict the motion of the group III-V device, stabilize the position of the group III-V device, prevent the group III-V device from sliding, falling, or tilting, or the like. One example of a suitable anchor is a portion of material operable to serve as a tether to fasten, tether, or otherwise couple the group III-V device to an adjacent fixed structure (e.g., the left structure).

As shown in the illustrated embodiment, one suitable embodiment of the anchor is a lithographically patterned photoresist anchor 354. The patterned photoresist anchor may represent a lithographically patterned portion of photoresist that may be formed by spin coating or otherwise depositing a photoresist layer over the top surface of the workpiece object, optionally baking the photoresist layer, and photo-lithographically patterning and developing the photoresist layer to leave a portion of the photoresist corresponding in size and position to the anchor, while removing other portions of the photoresist layer around the anchor. The photoresist anchor may represent a portion of the photoresist disposed or coupled with both the group III-V device and the adjacent fixed left structure. It is noted that the photoresist need not actually be disposed over the upper and lower electrical contacts (see for example FIG. 3F).

Another suitable embodiment of an anchor is an optional bridge 356 or other portion of the patterned protective layer 352. The bridge may represent a portion of the patterned protective layer allowed to remain over the top surface of the graded composition release layer coupled with both an adjacent or nearby fixed structure (e.g., the left structure) and the group III-V device. Such a bridge may also help to anchor or tether the group III-V device to the fixed structure. It is generally not necessary to include both the bridge of the patterned protective layer as well as the photoresist anchor.

In still other embodiments, other types of materials may be formed, or allowed to remain, coupled between the group III-V device and a nearby or adjacent fixed structure in order to serve as an anchor. For example, a bridge of one of the III-V compound semiconductor device layers 330 (see e.g., FIG. 3A) may be allowed to remain as an anchor. As another example, another piece or portion of material besides resist may be coupled between the group III-V device and a nearby or adjacent fixed structure.

Figure 3F:
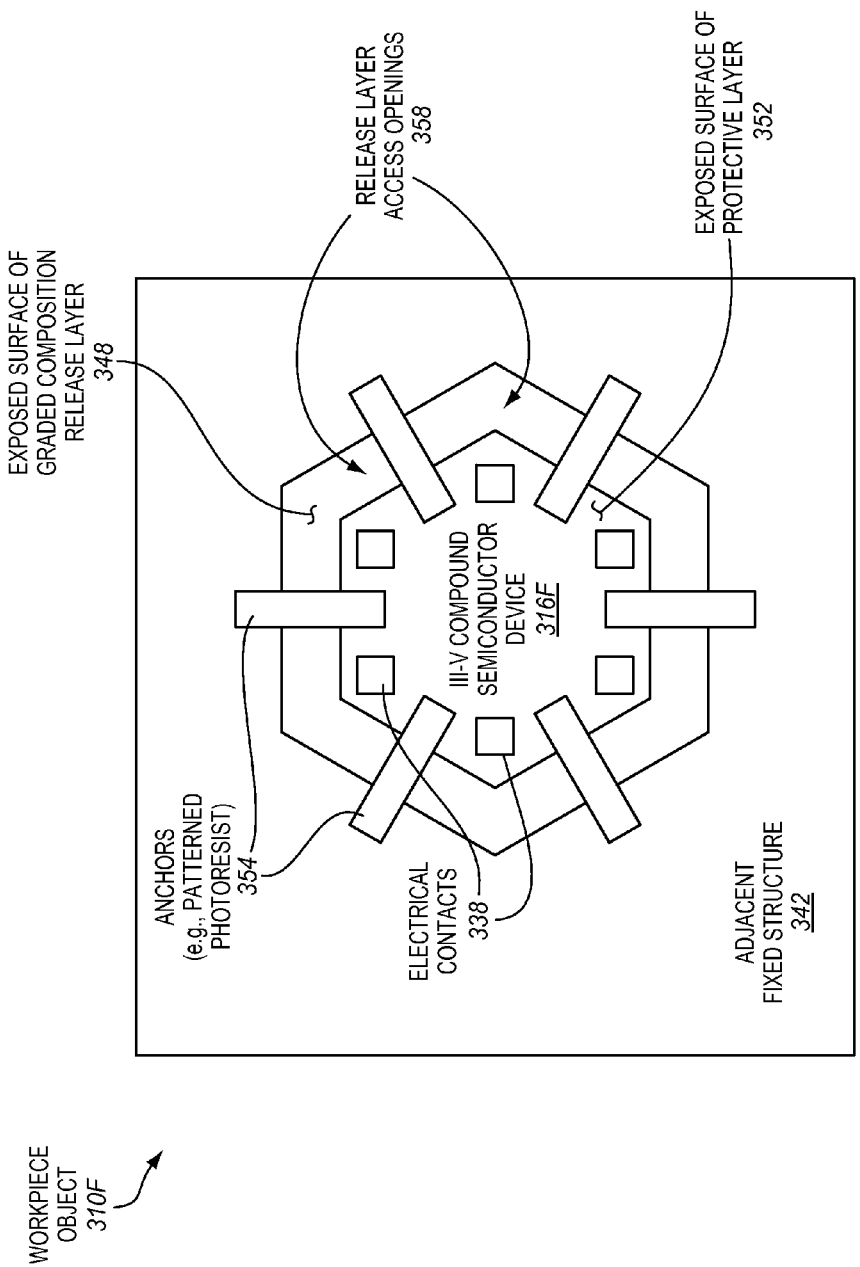

FIG. 3F is a top planar view of an embodiment of a workpiece object 310F having multiple anchors 354 disposed around a group III-V compound semiconductor device 316F. In the illustration, the group III-V device has a generally hexagonal shape, although this is not required. Other shapes are also suitable, such as, for example, other polygons (e.g., squares, rectangles, pentagons, triangles, and the like), circles, ovals, irregular shapes, etc. In this top planar view, the protective layer 352 over the group III-V device 316F is visible. Also, in this top planar view, the protective layer 352 on top of the adjacent fixed structure 342 surrounding the group III-V device is visible. Between the group III-V device and the adjacent fixed structure are generally hexagonally annular shaped release layer access openings 358. At the bottoms of the release layer access openings, is an exposed surface of the graded composition release layer 348. An etch of the graded composition release layer may be performed through the release layer access openings. In the illustrated embodiment, six approximately evenly spaced anchors are disposed around the circumference of the group III-V device, although in other embodiments fewer (e.g., a single) or more anchors may optionally be used. Also, the anchors need not surround the device. In some embodiments, the anchors may represent patterned photoresist anchors. Alternatively, other types of anchors may be used (e.g., a bridge of an etch stop layer). As readily seen in this view, in some embodiments, the anchors may optionally be formed at positions so that they do not cover the electrical contacts, which may make the electrical contacts available for contact with a receiving substrate, as will be discussed further below.

Figure 3G:
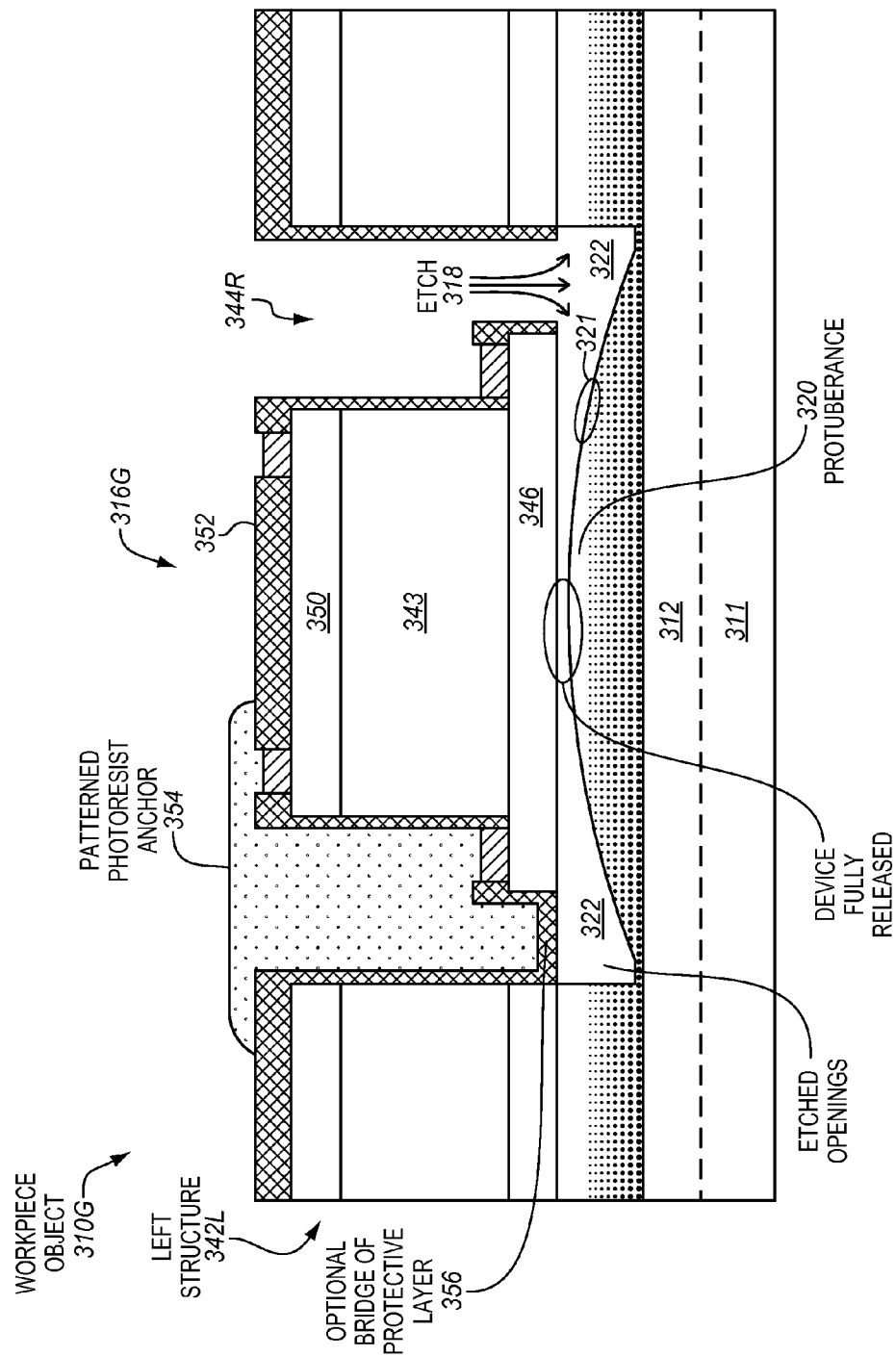

FIG. 3G shows an embodiment of a workpiece object 310G formed by performing an etch 318 on the graded composition release layer 314 of the workpiece object of 310E of FIG. 3E. Performing the etch may include introducing an etchant through the release layer access opening 358 or etchant entrance opening. In some embodiments, the etch may have an etch rate that depends on the composition of the at least one component that is graded across the thickness of the graded composition release layer. The illustration shows a suitable point for stopping the etch. Examples of suitable types of etches include, but are not limited to, an etch with hydrochloric acid and phosphoric acid (HCl:$H_3PO_4$), an etch with phosphoric acid, hydrogen peroxide, and water ($H_3PO_4$:$H_2O_2$:$H_2O$), and others known in the arts.

In embodiments, the etch may etch or form a protuberance 320 of the graded composition release layer between the group III-V device and the substrate. The protuberance provides a non-flat surface 321 (e.g., non-coplanar, curved, rounded, etc.) between the group III-V device and the substrate. In the illustrated embodiment, the protuberance has a generally hemispherical shape, although the scope of the invention is not so limited. Any of the otherwise shaped protuberances disclosed elsewhere herein e.g., truncated conical shapes, hill shapes, mound shapes, mesa shaped, irregular shaped, etc.) may be used instead. Etch openings 322 have been etched or defined between the protuberance and the group III-V device where portions of the graded composition release layer have been etched away or removed while etching the protuberance. One significant advantage of the protuberance and/or the non-flat surface between the group III-V device and the substrate is that they may help to limit or reduce contact areas between the group III-V device and other nearby surfaces. This in turn may help to limit or reduce stiction and/or other generally undesired attractive forces between the group III-V device and these surfaces. Even if the group III-V device falls, it should generally only contact the top or apex of the protuberance along a relatively small surface area.

In some embodiments, the etch may continue on the graded composition release layer until the group III-V device 316G is at least substantially released from the substrate 311. In the illustrated embodiment, the group III-V device has been fully released from the substrate. As shown, there is a small gap between the top of the protuberance and the bottom of the group III-V device. Such a fully released device may represent a suspended or free-floating device which is not physically coupled with the substrate by a portion of the graded composition release layer. In such a case, the anchor 354 may help to anchor the suspended or free-floating group III-V device to the adjacent fixed left structure 342L to help prevent it from falling.

Figure 3H:
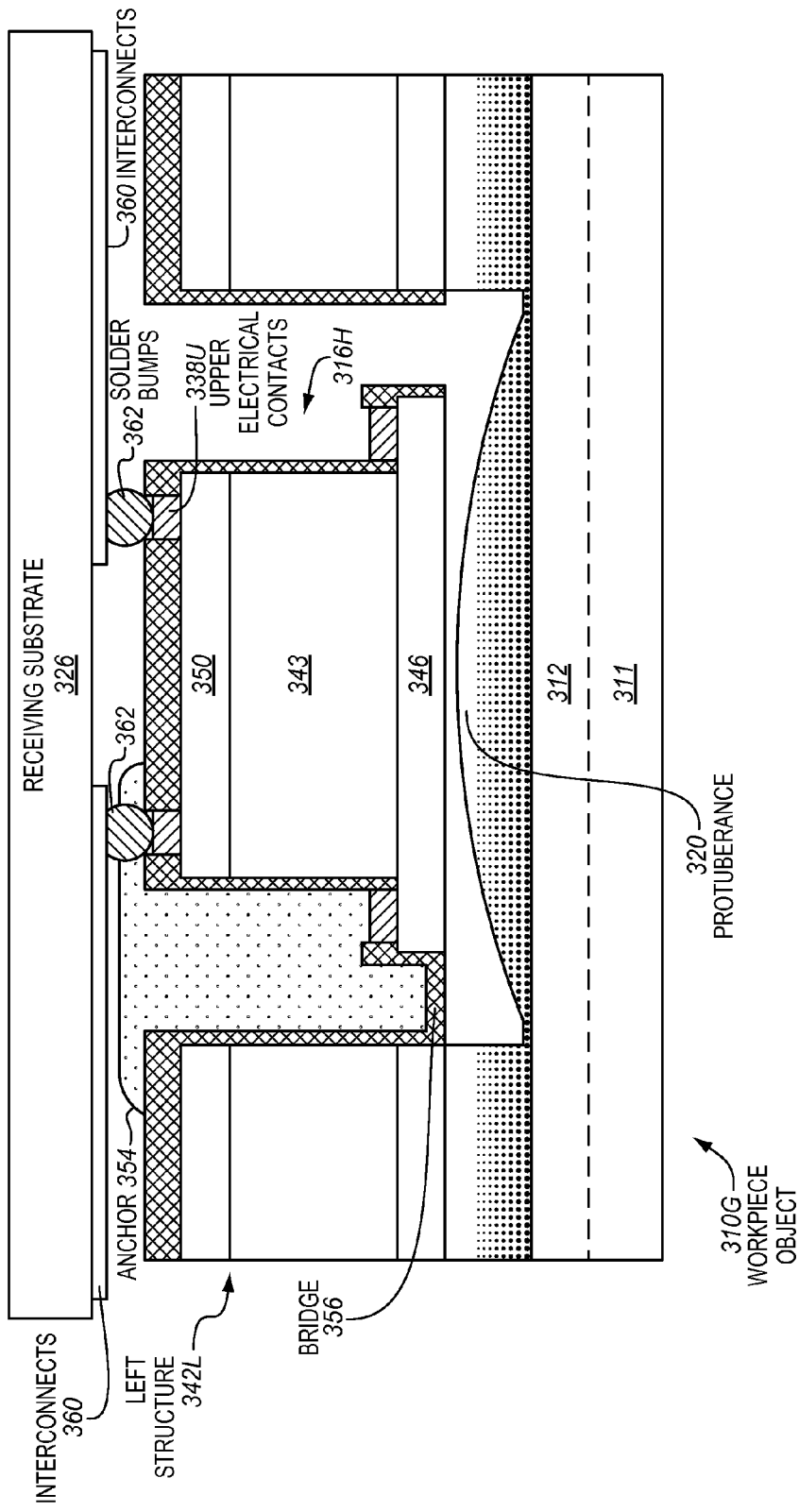

FIG. 3H shows an embodiment of coupling an embodiment of a receiving substrate 326 with the group III-V device of the workpiece object 310G of FIG. 3G. The receiving substrate may be physically and/or electrically coupled with the top surface of the group III-V device. The receiving substrate may represent any of various substrates known in the arts which are operable to lift off, peel off, extract, or otherwise receive the group III-V device from the substrate 311. In some embodiments, a flexible and puncture proof receiving substrate may optionally be used, although this is not required.

In some embodiments, the receiving substrate may represent a circuit. For example, in various embodiments, the receiving substrate may represent a rigid printed circuit board, a flexible printed circuit board, a flexible circuit, an organic chip carrier, an organic circuit board, a ceramic chip carrier, or the like. The receiving substrate may have interconnects 360 including electrical contacts. The interconnects may represent patterned electrically conductive material insulated by surrounding dielectric material. In some embodiments, coupling the receiving substrate with the group III-V device may include electrically coupling the electrical contacts of the receiving substrate with corresponding electrical contacts of the group III-V device. The receiving substrate may have its electrical contacts formed into mating or matching aligned positions with the electrical contacts of the devices to be lifted off. The side of the workpiece object 310G having the upper electrical contacts may represent a receiving substrate contact side or a metallization side.

In some embodiments, reflowed solder bumps 362 may be used to physically and electrically couple the electrical contacts of the receiving substrate 326 with corresponding upper electrical contacts 338U of the group III-V device 316H. The reflowed solder bumps represent an example of coupling members. The solder humps 362 may initially be included on either the electrical contacts of the receiving substrate or the upper electrical contacts of the group III-V device. The receiving substrate and the group III-V device may be aligned or positioned so that the electrical contacts are aligned relative to one another with the solder bumps disposed between them. The receiving substrate and the group III-V device may be brought together so that the corresponding electrical contacts are physically and electrically coupled through the intervening solder bumps. Either one or both of the substrates may be moved relative to the other. In the illustration, the electrical contacts of the receiving substrate are positioned above the solder humps. The solder bumps may be melted or reflowed and then cooled and solidified to physically and electrically couple the receiving substrate with the group III-V device. Alternatively, instead of solder humps, other portions of solder, other metal bumps, other metal particles, other reflowable metals, other reflowable conductive materials, conductive adhesives, or the like, may be used as the coupling members to couple the electrical contacts and/or the receiving substrate with the group III-V device.

In the illustrated embodiment, electrical contacts are used to couple the receiving substrate with the group III-V device. In other embodiments, it is not required that the receiving substrate be coupled with the group III-V device through such electrical contacts. For example, in other embodiments, glue, sticky material, tacky material, adhesive material, or the like, may be disposed between the contact surfaces of the receiving substrate and the group III-V device to couple them. For example, the receiving substrate may have an adhesive backing similar to a tape to physically but not electrically couple with the group III-V device. In still other embodiments, a combination of such solder humps or other electrical coupling members and an adhesive material may optionally be used to provide even greater couplings.

Figure 3I:
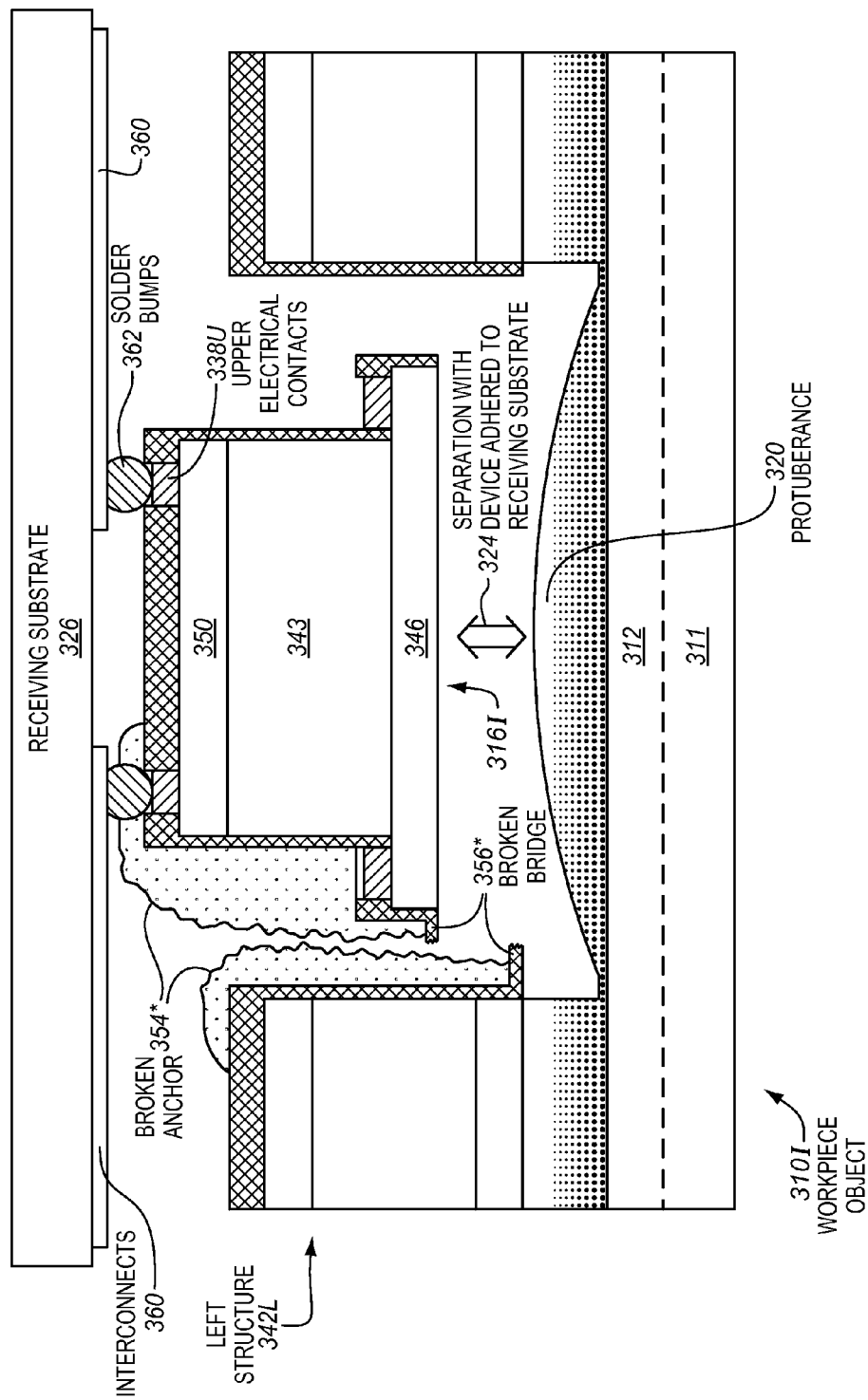

FIG. 3I shows an embodiment of separating 324 the receiving substrate 326 having the group III-V device 316I coupled therewith from the substrate 311. In various aspects, the receiving substrate may be moved relative to the substrate, the substrate may be moved relative to the receiving substrate, or both the receiving substrate and the substrate may be moved relative to one another. The physical coupling of the receiving substrate with the group III-V device may be stronger than the physical coupling of the substantially released group III-V device with the substrate. As a result, the group III-V device may remain coupled with the receiving substrate, and the group III-V device may fully release (if it is not already) and separate from the substrate. The separation force applied may cause any remaining portion of the graded composition release layer coupling the group III-V device to the substrate to sever or break. The separation force applied may also cause any present anchors to sever or break. For example, the patterned photoresist anchor 354 may sever or break as shown by broken photoresist anchor 354*. Note that it is also possible for the patterned photoresist anchor to merely become detached from one of the left structure and the group III-V device instead of actually being ripped apart or severed. Subsequently, any remaining photoresist may optionally be removed by stripping, dissolved in a suitable solvent (e.g., acetone, isopropyl alcohol, etc.), or otherwise removed. Also, the bridge anchor 356 may sever or break as shown by broken bridge 356*.

It has been previously mentioned that the etch has been performed until the group III-V device and/or the other semiconductor devices have been "substantially released." As used herein, the term "substantially released" encompasses the semiconductor device being either fully released and/or released enough that the semiconductor device can be separated from the substrate using less force than would be required to break the coupling between the receiving substrate and the semiconductor device. For example, any remaining coupling of the semiconductor device with the substrate through a remaining contact with a protuberance and/or through any anchors may be less than the coupling strength of the mechanism used to couple the receiving substrate with the semiconductor device (e.g., reflowed solder bonds, adhesive, etc.).

In the illustrated embodiment, separating the group III-V device from the substrate also involves separating the group III-V device from the protuberance 320 and/or non-flat surface 321, although this is not required. In some embodiments, this may involve lifting the group III-V device from off the top of the protuberance and/or non-flat surface. In such cases, a relatively weak coupling of the group III-V device with the protuberance may be broken or severed. Notice in the illustration that the protuberance remains behind still coupled with the substrate. In other embodiments, the protuberance may instead remain coupled with the group III-V device.

In some embodiments, the separation of the receiving substrate having the group III-V device coupled therewith from the substrate may be performed as part of a wafer-level lift off of multiple or potentially many such group III-V devices dispersed across the length of the substrate. In some embodiments, all such group III-V devices may be lifted off in one such lift-off operation with one receiving substrate. Alternatively, different groups or subsets of the group III-V devices may be lifted off during different lift-off operations with different receiving substrates. For example, two, three, or four, or more of such lift-off operations may be used. Advantageously, such ability to separate the group III-V devices from the substrate through the use of the receiving substrate may represent an efficient way to handle the group III-V devices and/or allow efficient assembly into a module, package, or other deployment. There may be no requirement to use a pick-and-place machine, or otherwise handle individual ones of the devices.

As previously mentioned, various different combinations of group III-V compound semiconductor and related materials may be used to form various different types of semiconductor devices. To further illustrate certain concepts, FIGS. 4-5 show several embodiments of suitable sets of materials, although the scope of the invention is not limited to just these materials.

Figure 4:
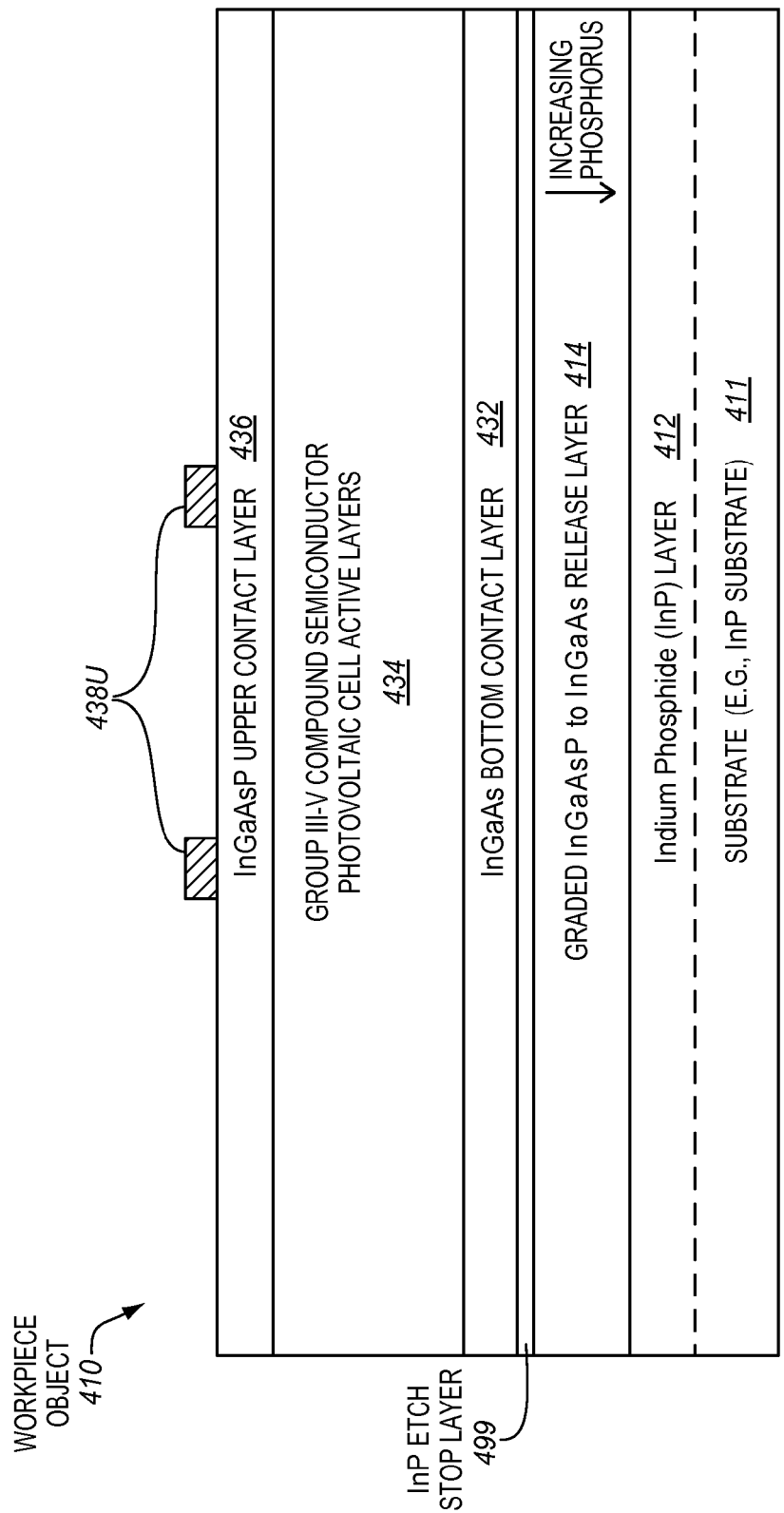
FIG. 4 is a cross-sectional side view of an embodiment of a workpiece object including a first embodiment of a suitable set of materials.

FIG. 4 is a cross-sectional side view of an embodiment of a workpiece object 410 including a first embodiment of a suitable set of materials. The workpiece object includes a substrate 411. As one example, the substrate may represent an indium phosphide (InP) substrate, although this is not required. An InP layer 412 is included in or formed over and/or on the substrate. A lattice matched graded composition indium-gallium-arsenide-phosphide (InGaAsP) to indium-gallium-arsenide (InGaAs) release layer 414 is formed over and/or on the InP layer 412. In some embodiments, the composition of phosphorous may increase in the direction leading toward the InP layer 412 and/or from the top to the bottom of the layer (as viewed). An InP etch stop layer 499 is formed over the graded layer 414. A lattice matched indium-gallium-arsenide (InGaAs) bottom contact layer 432 is formed over and/or on the graded composition release layer. A lattice matched set of group III-V compound semiconductor photovoltaic cell active layers 434 (or active layers for other types of group III-V compound semiconductor devices) are formed over and/or on the bottom contact layer. A lattice matched InGaAsP upper contact layer 436 is formed over and/or on the group III-V compound semiconductor active layers. Upper electrical contacts 438U (e.g., gold pads) are formed over the InGaAsP upper contact layer.

Figure 5:
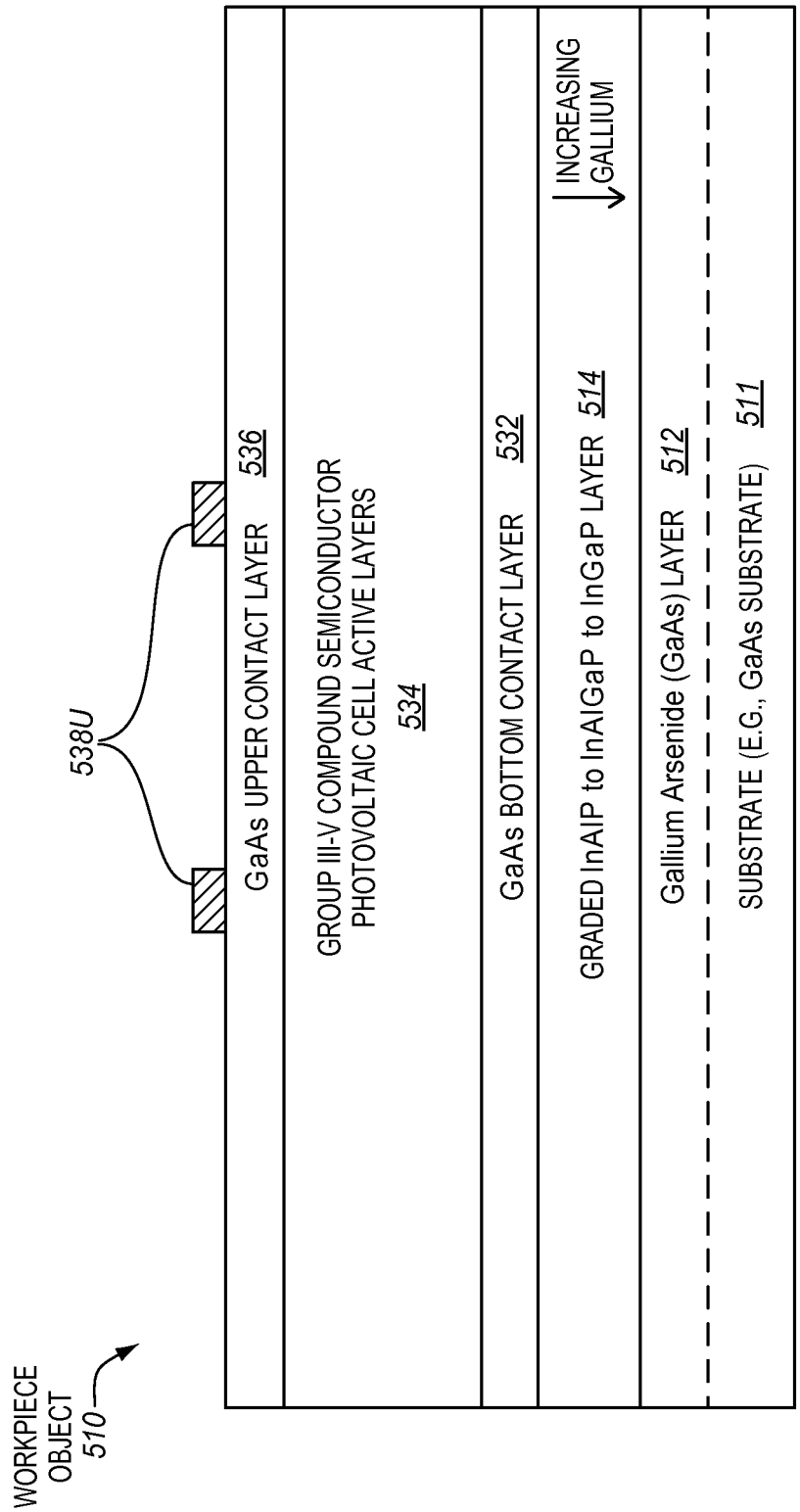
FIG. 5 is a cross-sectional side view of an embodiment of a workpiece object including a second embodiment of a suitable set of materials.

FIG. 5 is a cross-sectional side view of an embodiment of a workpiece object 510 including a second embodiment of a suitable set of materials. The workpiece object includes a substrate 511. As one example, the substrate may represent a gallium-arsenide (GaAs) substrate, although this is not required. A GaAs layer 512 is included or formed over and/or on the substrate 511. A lattice matched graded composition indium-aluminum-phosphide (InAlP) to indium-aluminum-gallium-phosphide (InAlGaP) to indium-gallium-phosphide (InGaP) release layer 514 is formed over and/or on the GaAs layer 512. In some embodiments, the composition of gallium may increase in the direction leading toward the GaAs layer 512 and/or from the top to the bottom of the layer (as viewed). A lattice matched GaAs bottom contact layer 532 is formed over and/or on the graded composition release layer. A lattice matched set of group III-V compound semiconductor photovoltaic cell active layers 534 (or active layers for other types of group III-V compound semiconductor devices) are formed over and/or on the bottom contact layer. A lattice matched GaAs upper contact layer 536 is formed over and/or on the group III-V compound semiconductor active layers. Electrical contacts 538U (e.g., gold pads) are formed over the AlGaAs upper contact layer.

It is to be appreciated that these are just a few illustrative examples of suitable materials. Other sets of suitable materials will be apparent to those skilled in the arts and having the benefit of the present disclosure. For example, sapphire materials, germanium based devices, gallium nitride based devices, or other materials known in the arts may be used.

FIGS. 6A-6D are cross-sectional side views illustrating several alternate embodiments of suitable protuberances 620. Any of these protuberances may be used in any of the methods or approaches disclosed herein. In each of these embodiments, the protuberance 620 is disposed between a substrate 612 and a semiconductor device 616.

Figure 6A:
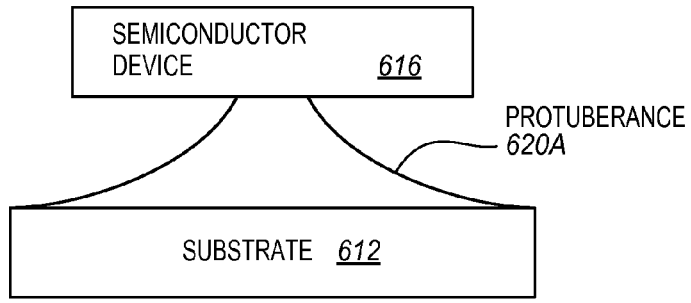
FIGS. 6A-6D are cross-sectional side views illustrating several other embodiments of suitable protuberances.

FIG. 6A illustrates a first embodiment of a suitable protuberance 620A. The protuberance has an approximately truncated conical shape with recessed or concave sidewalls. The semiconductor device is still partly directly connected to the protuberance at a relatively small area at the top of the protuberance (i.e., at the truncated part of the cone). The recessed or concave sidewalls may help to reduce the contact area between the semiconductor device with the protuberance in cases where the semiconductor device unintentionally slips or falls. Even if the semiconductor device were to slip or fall, it still would still generally contact the protuberance only at small surface areas due in part to the recessed or concave sidewalls. As discussed above, this may help to reduce stiction and/or other attractive forces.

Figure 6B:
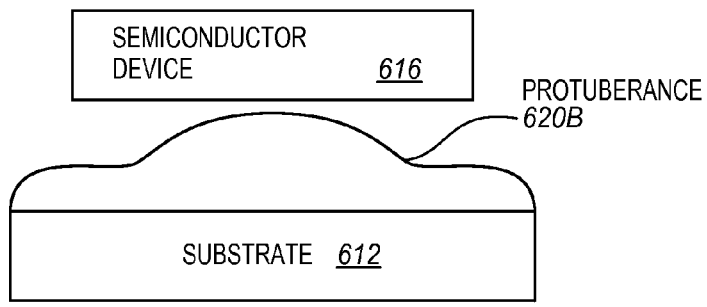

FIG. 6B illustrates a second embodiment of a suitable protuberance 620B. The protuberance has a central relatively flat mesa or top and recessed or concave sidewalls. The semiconductor device is fully released from the protuberance. Again in this embodiment, the recessed or concave sidewall may help to reduce the contact area between the semiconductor device with the protuberance in cases where the semiconductor device unintentionally slips or falls.

Figure 6C:
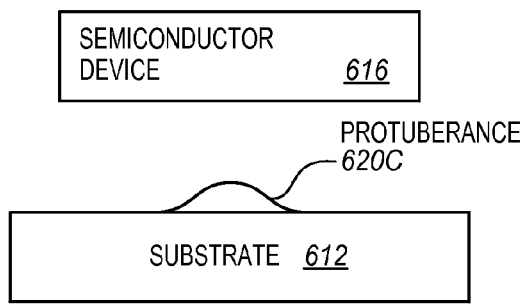

FIG. 6C illustrates a third embodiment of a suitable protuberance 620C. The protuberance has a shape of a small bulge or mound or hill of material. The semiconductor device is fully released from the protuberance. Moreover, the protuberance has been further etched until it is relatively small. If the semiconductor device were to slip or fall, the protuberance may help to prevent the semiconductor device from lying flat on the top surface of the substrate. Rather, the semiconductor device will contact the protuberance at only a significantly smaller area should it fall. It should be appreciated that various otherwise shaped small protuberances (e.g., amounting to some sort of a bump, projection, or protuberance from the surface) may accomplish a similar objective of preventing the semiconductor device from lying flat on the top surface of the substrate should it slip or fall.

Figure 6D:
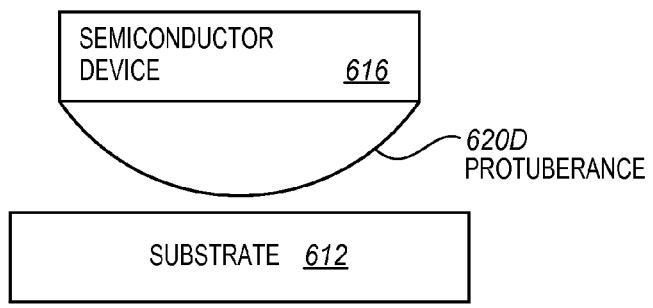

FIG. 6D illustrates a fourth embodiment of a suitable protuberance 620D. The protuberance has an approximately hemispherical shape. Notice that in contrast to the protuberances 220 of FIGS. 2B-2C, the protuberance 620D remains coupled with the semiconductor device 616 instead of with the substrate 612. The approximately hemispherical shape of the protuberance faces the substrate instead of the semiconductor device. When the semiconductor device is separated from the substrate, the protuberance will remain coupled with the semiconductor device and will separate from the substrate. In some embodiments, the approximately hemispherically shaped protuberance may be operable to serve as a lens and/or focus light on the semiconductor device. By way of example, the semiconductor device may include a photovoltaic device and the lens shaped or light focusing protuberance may help to focus or concentrate solar radiation or other light onto the photovoltaic device. Alternatively, the semiconductor device may represent a photodiode array or other optical device. In other embodiments, rather than the approximately hemispherical shape, any other shape suitable to focus light and/or serve as a lens may be used instead. If the protuberance is formed of a graded composition release layer then the protuberance may represent a graded composition protuberance that has a graded composition across its thickness.

These are just a few representative examples of suitable sizes and shapes for protuberances 620 and/or non-flat surfaces. Those skilled in the art, and having the benefit of the present disclosure, will appreciate that various other sizes and shapes of protuberances and/or non-flat surfaces may be used instead. Various different shapes may be achieved depending upon the particular geometry and dimensions, the particular etch (e.g., the level of anisotropy), the particular grading, the particular effect of the grading on the etch rate, and the like. The particular grading (e.g., the compositions and the profiles of the compositions across the thickness of the graded composition release layer) may be modified to achieve a desired shape of a protuberance by those skilled, in the art and having the benefit of the present disclosure. For example, linear profiles, non-linear profiles, stepwise profiles, or combinations thereof may be selected for the gradation of the graded composition release layer in order to help tailor the shape. In addition, in some embodiments the composition of the graded composition release layer may also be modulated laterally in addition to being graded in the thickness of the layer. For example, material having a higher or lower composition of the salient component may be introduced at a central region between a semiconductor device and a substrate as compared to a periphery of the region between the semiconductor device and the substrate.

Figure 7:
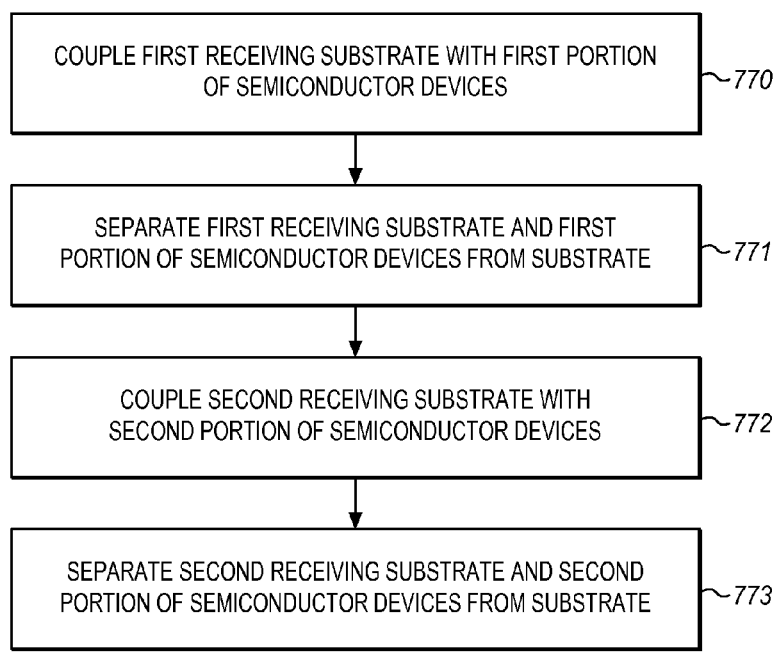
FIG. 7 is a block flow diagram of an embodiment of a method of separating semiconductor devices from a substrate using first and second receiving substrates.

FIG. 7 is a block flow diagram of an embodiment of a method 704 of separating semiconductor devices from a substrate using first and second receiving substrates. The method includes coupling a first receiving substrate with a first portion or subset of the semiconductor devices formed over a substrate, at block 770. In some embodiments, electrical contacts of the first receiving substrate and the first portion of the semiconductor devices may be physically and electrically coupled (e.g., using reflowed solder bumps). In some embodiments, a protuberance and/or non-flat surface may be disposed between each of the first portion of the semiconductor devices and the substrate. The first portion of the semiconductor devices may be coupled with the substrate by the protuberances and/or by anchors. The first receiving substrate and the first portion of the semiconductor devices may be separated from the substrate, at block 771. A second receiving substrate may be coupled with a second, different portion or subset of the semiconductor devices formed over the substrate, at block 772. In some embodiments, electrical contacts of the second receiving substrate and the second portion of the semiconductor devices may be physically and electrically coupled (e.g., using reflowed solder bumps). In some embodiments, a protuberance and/or non-flat surface may be disposed between each of the second portion of the semiconductor devices and the substrate. The second portion of the semiconductor devices may be coupled with the substrate by the protuberances and/or by anchors. The second receiving substrate and the second portion of the semiconductor devices may be separated from the substrate, at block 773. In other embodiments, three or more different receiving substrates may optionally be used.

Figure 8:
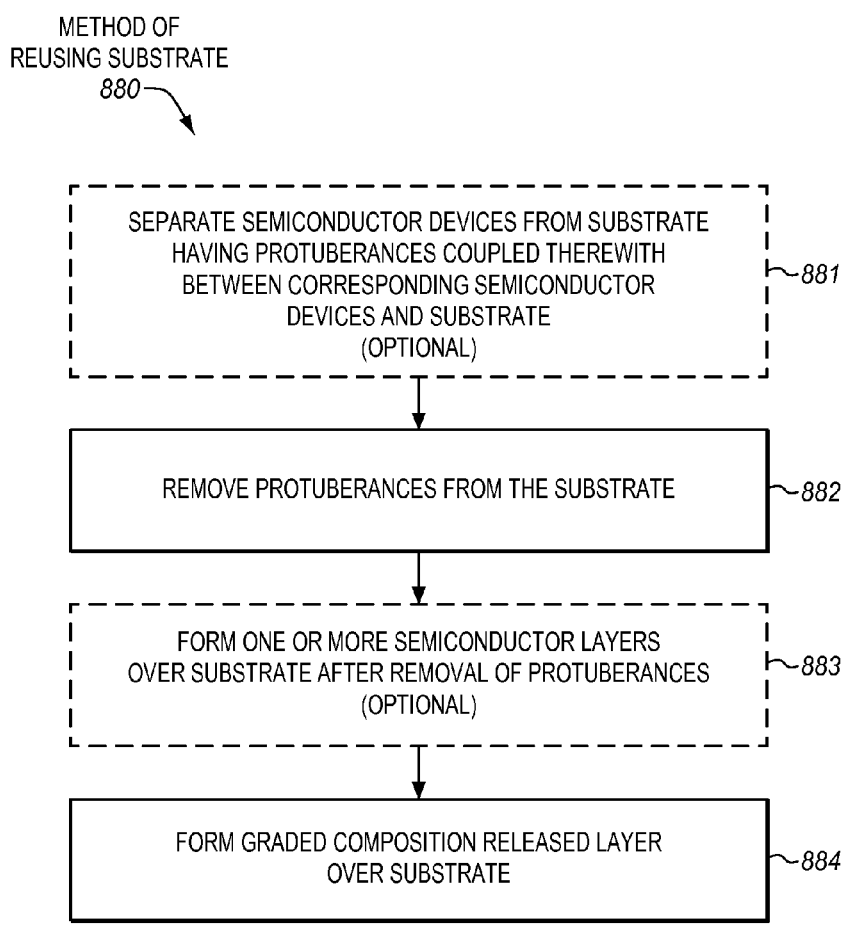
FIG. 8 is a block flow diagram of an embodiment of a method of reusing a substrate.

FIG. 8 is a block flow diagram of an embodiment of a method 880 of reusing a substrate. The method optionally includes separating semiconductor devices from a substrate, at block 881. This may be done substantially as described in conjunction with FIG. 2C and/or FIG. 3I. In some embodiments, the substrate has protuberances coupled therewith between corresponding semiconductor devices and the substrate. The various protuberances disclosed elsewhere herein are suitable including their features and optional details. The method includes removing the protuberances from the substrate, at block 882. In some embodiments, this may include etching the protuberances from the substrate. In other embodiments, this may include performing a chemical mechanical polishing (CMP) or other planarization operation. In still other embodiments, other surface planarization or material removal methods may optionally be used. In addition to the protuberances, such operations may also remove other structures or materials, such as, for example, the fixed structures 342L, 342R, other structures or materials over or at the same level as the protuberances, etc. The method optionally includes forming one or more semiconductor layers over the substrate after the removal of the protuberances, at block 883. For example, this may be used to replace or increase the thickness of the group III-V compound semiconductor layer 312 if it has been removed or partially removed. In some embodiments, one or more layers may be epitaxially grown over the substrate. The method includes forming a layer, for example a graded composition release layer, over the substrate, at block 884. The various graded composition release layers disclosed elsewhere herein are suitable including their features and optional details. Subsequently, other layers may be formed, such as, for example, group III-V compound semiconductor device layers, and then the layers may be processed substantially as described elsewhere herein to release and separate semiconductor devices. In other cases, other layers besides a graded composition release layer may be formed over the substrate. For example, this may be the case when the substrate is reused to form other types of devices that utilize different types of layers. Advantageously, the ability to reuse the substrate may help to reduce manufacturing costs.

In the description above, embodiments have been shown and described as using a graded composition release layer. As described, the grading of the composition of the graded composition release layer may change the etch rate of the etch used to etch the layer and may be used as a way to help control the shape and size of the protuberances. Often such grading may allow more control over the shape. However, the use of such grading composition release layers is not required. In other embodiments, a non-graded composition release layer (e.g., a release layer having homogeneous composition across its thickness) may instead be used. Protuberances may still be formed by etching such a non-graded composition release layer based on the positions of the etchant access openings. For example, protuberances generally centered under a semiconductor device may be formed by including etchant access openings disposed around the perimeter of the semiconductor device. In some embodiments, the positions and/or sizes of the etchant access openings may be arranged to achieve a desired shape and/or size of the protuberance. Accordingly, in the various embodiments disclosed herein the graded composition release layers may optionally be replaced by a non-graded or homogeneous composition release layer.

The operations, features, and other details described for any of FIGS. 2A-2C, FIGS. 3A-3I, FIGS. 4-5, and FIGS. 6A-6D may also optionally be used in any of FIGS. 1, 7, and 8. Moreover, components, features, and details described herein for any of the apparatus (e.g., the workpiece objects, intermediate substrates, etc.) may also optionally be used in any of the methods described herein, which in embodiments may be performed on or with such apparatus.

The semiconductor devices separated as disclosed herein may be used in a variety of different modules, electronic devices, or systems. For example, in the case of photovoltaic cells or devices, they may be used in modules for personal electronic devices (e.g., laptops, cell phones, cameras, other portable electronic devices), outdoor gear (e.g., outdoor lighting), military equipment (e.g., communication equipment, positioning equipment, etc.), building-integrated photovoltaics, rooftop photovoltaics, ground-mounted solar farms, roadside emergency telephones, remote sensing, and cathodic protection of pipelines, and various other known uses of solar cells.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
   etching a release layer that is coupled between a plurality of semiconductor devices and a substrate with an etch, including:
   etching the release layer between the semiconductor devices and the substrate until the semiconductor devices are at least substantially released from the substrate; and
   etching protuberances in the release layer such that a protuberance is etched between each of the semiconductor devices and the substrate;
   stopping the etching while the protuberances remain between each of the semiconductor devices and the substrate; and
   separating the semiconductor devices from the substrate.

2. The method of claim 1, wherein etching the release layer comprises etching a graded composition release layer with the etch that has an etch rate that depends on a composition of at least one component that is graded across a thickness of the graded composition release layer.

3. The method of claim 2, wherein etching the graded composition release layer comprises etching a graded composition group III-V compound semiconductor release layer.

4. The method of claim 1, wherein etching the release layer comprises etching the release layer coupled between photovoltaic cells and the substrate.

5. The method of claim 1, further comprising forming at least one anchor that is coupled between the plurality of semiconductor devices and an adjacent fixed structure such that at least one said anchor is coupled between a said semiconductor device and the adjacent fixed structure, prior to etching the protuberances.

6. The method of claim 5, wherein firming the anchor comprises:
   depositing a layer of photoresist over the semiconductor device and the adjacent fixed structure; and
   photolithographically patterning the layer of the photoresist to leave a portion of the layer of the photoresist corresponding to the anchor coupled with the semiconductor device and the adjacent fixed structure while removing a portion of the layer of the photoresist around the anchor.

7. The method of claim 5, wherein separating the semiconductor devices from the substrate comprises at least one of: (a) breaking the anchor; and (b) separating the anchor from at least one of the semiconductor device and the adjacent fixed structure.

8. The method of claim 1, wherein separating the semiconductor devices from the substrate comprises:
   coupling at least one receiving substrate with the semiconductor devices; and
   separating the at least one receiving substrate and the semiconductor devices from the substrate.

9. The method of claim 8, wherein etching the release layer comprises etching a graded composition release layer, and wherein separating the semiconductor devices from the substrate comprises:
   coupling a first receiving substrate with a first portion of the semiconductor devices;
   separating the first receiving substrate and the first portion of the semiconductor devices from the substrate;
   coupling a second receiving substrate with a second portion of the semiconductor devices; and
   separating the second receiving substrate and the second portion of the semiconductor devices from the substrate.

10. The method of claim 8, wherein coupling the at least one receiving substrate with the semiconductor devices comprises coupling at least one flexible receiving substrate with the semiconductor devices.

11. The method of claim 1, wherein separating the semiconductor devices from the substrate comprises separating the semiconductor devices from the protuberances which remain coupled with the substrate.

12. The method of claim 1, wherein separating the semiconductor devices from the substrate comprises separating the semiconductor devices having the protuberances coupled therewith from the substrate.

13. The method of claim 12, wherein etching the protuberances comprises etching the protuberances into shapes of lenses operable to focus light on the corresponding semiconductor devices.

14. The method of claim 1, further comprising, after separating the semiconductor devices from the substrate:
   removing the protuberances from the substrate; and
   forming a layer over the substrate after the removal of the protuberances from the substrate.

15. A method comprising:
   coupling a first receiving substrate with a first subset of semiconductor devices, each of the semiconductor devices of the first subset disposed over a substrate with a corresponding protuberance disposed between the semiconductor device of the first subset and the substrate;
   separating the first receiving substrate and the first subset of the semiconductor devices from the substrate;
   coupling a second receiving substrate with a second subset of the semiconductor devices, each of the semiconductor devices of the second subset disposed over the substrate with a corresponding protuberance disposed between the semiconductor device of the second subset and the substrate; and
   separating the second receiving substrate and the second subset of the semiconductor devices from the substrate.

16. The method of claim 15, wherein the protuberances have graded compositions.

* * * * *